(12) United States Patent
Yamaguchi et al.

(10) Patent No.: US 10,131,030 B2
(45) Date of Patent: Nov. 20, 2018

(54) BUFFING APPARATUS AND SUBSTRATE PROCESSING APPARATUS

(71) Applicant: EBARA CORPORATION, Tokyo (JP)

(72) Inventors: Kuniaki Yamaguchi, Tokyo (JP); Itsuki Kobata, Tokyo (JP); Toshio Mizuno, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 441 days.

(21) Appl. No.: 14/879,786

(22) Filed: Oct. 9, 2015

(65) Prior Publication Data

US 2016/0101498 A1    Apr. 14, 2016

(30) Foreign Application Priority Data

Oct. 10, 2014  (JP) ................... 2014-209063
Dec. 9, 2014   (JP) ................... 2014-248996

(51) Int. Cl.
  *B24B 37/11*    (2012.01)
  *H01L 21/67*    (2006.01)

(52) U.S. Cl.
  CPC ........ *B24B 37/11* (2013.01); *H01L 21/67051* (2013.01); *H01L 21/67173* (2013.01); *H01L 21/67178* (2013.01); *H01L 21/67219* (2013.01)

(58) Field of Classification Search
  CPC ......... B24B 49/10; B24B 49/00; B24B 37/11; B24B 21/67092; H01L 21/67075
  USPC ........................ 451/5, 41, 57, 65, 66, 73, 53
  See application file for complete search history.

(56) References Cited

U.S. PATENT DOCUMENTS

| | | | | |
|---|---|---|---|---|
| 6,200,201 B1 * | 3/2001 | Ravkin | ..................... | B08B 1/04 |
| | | | | 451/285 |
| 7,059,948 B2 * | 6/2006 | Li | ........................... | B23H 5/08 |
| | | | | 451/287 |
| 7,374,644 B2 * | 5/2008 | Butterfield | ............... | B23H 5/08 |
| | | | | 204/217 |
| 2002/0155795 A1 * | 10/2002 | Ferra | ...................... | B24B 29/00 |
| | | | | 451/57 |
| 2002/0177386 A1 * | 11/2002 | Smith | .................. | B24B 37/345 |
| | | | | 451/5 |

FOREIGN PATENT DOCUMENTS

| | | |
|---|---|---|
| JP | H08-071511 A | 3/1996 |
| JP | H11-090816 A | 4/1999 |
| JP | 2001-252861 A | 9/2001 |
| JP | 2010-050436 A | 3/2010 |

* cited by examiner

*Primary Examiner* — Robert Rose
(74) *Attorney, Agent, or Firm* — Baker & Hostetler LLP

(57) ABSTRACT

A buffing apparatus for buffing a substrate is provided. The apparatus includes: a buff table for holding the substrate, the buff table being rotatable; a buff head to which a buff pad for buffing the substrate is attachable, the buff head being rotatable and movable in a direction approaching the buff table and a direction away from the buff table, and an internal supply line for supplying process liquid for the buffing to the substrate being formed inside the buff head; and an external nozzle provided separately through the internal supply line in order to supply the process liquid to the substrate.

18 Claims, 19 Drawing Sheets

FIG. 17A
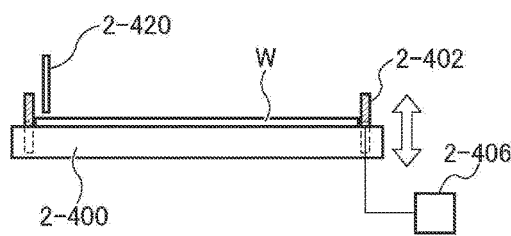
FIG. 17B
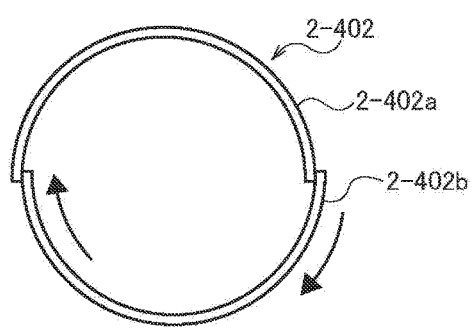
FIG. 17C
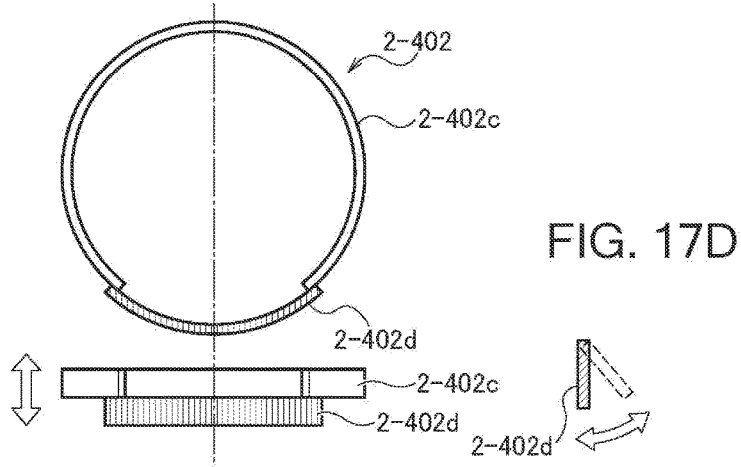
FIG. 17D
FIG. 17E
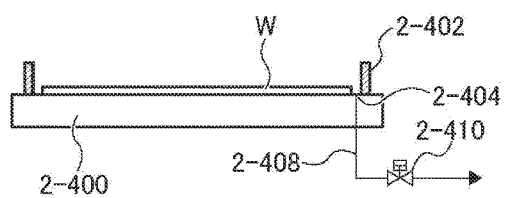

BUFFING APPARATUS AND SUBSTRATE PROCESSING APPARATUS

TECHNICAL FIELD

The present disclosure relates to a buffing technique for a substrate.

BACKGROUND ART

In manufacturing of a semiconductor device, there is known a chemical mechanical polishing (CMP) apparatus that polishes the surface of a substrate. A substrate processing system including the CMP apparatus includes a polishing unit (a CMP unit) for performing polishing of the substrate, a cleaning unit for performing cleaning and drying of the substrate, and a load/unload unit that passes the substrate to the polishing unit and receives the substrate cleaned and dried by the cleaning unit. In the polishing unit, a polishing pad is stuck on the upper surface of a polishing table and a polishing surface is formed. The polishing unit presses a surface to be polished to the substrate, which is held by a top ring, against the polishing surface and rotates the polishing table and the top ring while supplying slurry serving as polishing liquid to the polishing surface. Consequently, the polishing surface and the surface to be polished are relatively moved in a sliding manner and the surface to be polished is polished. Further, in a patent application of the applicant, a finishing unit that presses a contact member having a diameter smaller than the diameter of the substrate against the substrate after the polishing and relatively moves the substrate is provided in the CMP apparatus separately from a main polishing section to slightly additionally polish the substrate and clean the substrate.

CITATION LIST

Patent Literature

Patent Literature 1: Japanese Patent Application Laid-Open NO. 2010-50436
Patent Literature 2: Japanese Patent Application Laid-Open No. H8-71511

SUMMARY OF INVENTION

In the conventional substrate processing apparatus, a mechanical acting force acting on the substrate in the polishing unit increases. It is sometimes difficult to perform the polishing while suppressing damage to (a defect of) the substrate. It is sometimes difficult to efficiently clean and remove foreign matters having large adhesiveness in the cleaning unit. In order to improve productivity, it is desirable to improve a throughput of substrate processing.

In the conventional finishing unit, the process liquid is not sufficiently supplied in a boundary between the substrate and the contact member in contact with the substrate. For example, polishing speed cannot be sufficiently increased. There is still room of improvement in an effect of the cleaning. It is desirable to reduce a consumed amount of the process liquid.

The present disclosure has been devised in order to solve at least a part of the problems and can be realized as forms explained below.

[Form 1]

According to a first form of the present disclosure, there is provided a buffing apparatus for buffing a substrate. The buffing apparatus includes: a buff table for holding the substrate, the buff table being rotatable; and a buff head to which a buff pad for buffing the substrate is attachable. The buff head is rotatable and movable in a direction approaching the buff table and a direction away from the buff table. An internal supply line for supplying process liquid for the buffing to the substrate is formed inside the buff head. The buffing apparatus further includes an external nozzle provided separately from the internal supply line in order to supply the process liquid to the substrate.

With such a buffing apparatus, it is possible to perform post process of the substrate treated by a chemical mechanical polishing apparatus. With the buffing apparatus, it is possible to perform finish polishing while suppressing damage to (a defect of) the substrate. Alternatively, it is possible to eliminate damage caused by the chemical mechanical polishing apparatus. Alternatively, compared with conventional roll cleaning and pen cleaning, it is possible to efficiently clean and remove foreign matters and the like having large adhesiveness. Moreover, the buffing apparatus includes process liquid supplying means of two systems, i.e., the internal supply line formed on the inside of the buff head and the external noise. Therefore, if both of the process liquid is supplied using both the process liquid supplying means, irrespective of the position of the buff head (e.g., even when the buff head is dressed by a dresser disposed on the outside of the buff table), it is possible to uniformly supply a sufficient amount of the process liquid to a process surface of the substrate before the start of the buffing. Therefore, it is possible to further suppress the damage to the substrate. Alternatively, when the buff head is dressed in the dresser disposed on the outside of the buff table, it is possible to preload (supply beforehand) the process liquid from the external nozzle to the substrate during a dressing operation and while the buff head moves from the dresser to a contact position. Therefore, compared with when the buff head is moved from the dresser onto the substrate and, thereafter, the buffing is started after preloading the process liquid using only the internal supply line, it is possible to improve a throughput. Note that, in this application, the expression "buffing the substrate" includes buffing only a specific part on the substrate besides buffing the entire substrate.

[Form 2]

According to a second form of the present disclosure, in Form 1, the buffing apparatus further includes a control section configured to control the operation of the buffing apparatus. The control section is configured to control the buffing apparatus to, before the buff head approaches the buff table as close as a contact position for bringing the buff pad into contact with the substrate, supply the process liquid from the external nozzle in a state in which the buff table is rotated. According to such a form, since the process liquid is supplied to the substrate in a state in which the buff table is rotated, the process liquid is uniformly supplied over the entire substrate by the force of the rotation. Therefore, thereafter, when the buff pad rotates in the contact position, since a sufficient amount of the process liquid is present between the substrate and the buff pad, it is possible to suppress damage to the substrate or it is possible to improve cleaning efficiency.

[Form 3]

According to a third form of the present disclosure, in Form 2, the control section is configured to control the buffing apparatus to supply the process liquid through the internal supply line while the buff head approaches the buff table as close as the contact position. According to such a form, since a supply amount of the process liquid increases during preload, it is possible to more uniformly supply the process liquid over the entire substrate.

[Form 4]

According to a forth form of the present disclosure, in Form 2 or Form 3, the control section is configured to control the buffing apparatus to supply the process liquid only through the internal supply line of the internal supply line and the external nozzle after the start of the buffing or after elapse of a predetermined time from the start of the buffing. According to such a form, it is possible to reduce an amount of use of the process liquid.

[Form 5]

With a fifth form of the present disclosure, in Form 2 or Form 3, the control section is configured to control the buffing apparatus to supply the process liquid through both of the internal supply line and the external nozzle during the buffing. According to such a form, it is possible to suppress insufficiency of the process liquid during the buffing. Therefore, it is possible to suppress damage to the substrate or improve cleaning efficiency.

[Form 6]

According to a sixth form of the present disclosure, in Form 1, the buffing apparatus further includes a control section configured to control the operation of the buffing apparatus. The control section is configured to control the buffing apparatus to, before the buff head approaches the buff table as close as a contact position, supply the process liquid from the external nozzle in a state in which the rotation of the buff table is stopped, and to move the buff head to the contact position after the supply is started, and start the rotation of the buff table. According to such a form, it is possible to efficiently preload the process liquid to a region on the substrate in contact with the buff head and suppress damage to the substrate. Alternatively, it is possible to improve cleaning efficiency.

[Form 7]

According to a seventh form of the present disclosure, there is provided a buffing apparatus for buffing a substrate. The buffing apparatus includes: a buff table for holding the substrate, the buff table being rotatable; and a buff head to which a buff pad for buffing the substrate is attachable. The buff head is rotatable and movable in a direction approaching the buff table and a direction away from the buff table. An internal supply line for supplying process liquid for the buffing to the substrate is formed inside the buff head. The buffing apparatus further includes a control section configured to control the operation of the buffing apparatus. The control section is configured to control the buffing apparatus to, before the buff head approaches the buff table as close as a position for bringing the buff pad into contact with the substrate, supply the process liquid through the internal supply line in a state in which the buff table is rotated. According to such a form, since the process liquid is supplied to the substrate in the state in which the buff table is rotated, the process liquid is uniformly supplied over the entire substrate by a force of the rotation. Therefore, it is possible to suppress damage to the substrate. Alternatively, it is possible to improve cleaning efficiency.

[Form 8]

According to an eighth form of the present disclosure, there is provided a buffing apparatus for buffing a substrate. The buffing apparatus includes: a buff table for holding the substrate, the buff table being rotatable; and a buff head to which a buff pad for buffing the substrate is attachable. The buff head is rotatable and movable in a direction approaching the buff table and a direction away from the buff table. An internal supply line for supplying process liquid for the buffing to the substrate is formed inside the buff head. The buffing apparatus further includes a control section configured to control the operation of the buffing apparatus. The control section is configured to supply the process liquid through the internal supply line after the buff head approaches the buff table as close as a position for bringing the buff pad into contact with the substrate in a state in which the rotation of the buff table and the buff head is stopped and start the rotation of the buff table and the buff head after the process liquid is supplied for a predetermined time. According to such a form, it is possible to start the buffing at least after a sufficient amount of the process liquid spreads between the buff pad and the substrate. Therefore, it is possible to suppress damage to the substrate. Alternatively, cleaning efficiency can be improved.

[Form 9]

According to a ninth form of the present disclosure, in any one of Form 2 to Form 8, the control section is configured to control the buff head such that a first load acts on the substrate with the buff head in an initial period of the buffing and a second load larger than the first load acts on the substrate with the buff head in a period after the initial period. According to such a form, in the initial period when the process liquid less easily uniformly spreads over the substrate, by performing the buffing with a relatively small load, it is possible to suppress the substrate from being damaged.

[Form 10]

According to a tenth form of the present disclosure, there is provided a substrate processing apparatus. The substrate processing apparatus includes: a chemical mechanical polishing apparatus; and the buffing apparatus according to any one of Form 1 to Form 9 for performing post process of a substrate processed by the chemical mechanical polishing apparatus. With such a substrate processing apparatus, an effect same as the effect of any one of Form 1 to Form 9 is attained.

[Form 11]

According to an eleventh form of the present disclosure, there is provided a method for buffing a substrate with a buffing apparatus. The method includes: a step of disposing a substrate on a buff table for rotatably holding the substrate; a step of, before bringing a buff pad attached to a buff head, in which an internal supply line for supplying process liquid for buff process to the substrate is formed, into contact with the substrate, supplying the process liquid from an external nozzle in a state in which the buff table is rotated; and a step of performing the buffing while supplying the process liquid through the internal supply line after the step of supplying the process liquid from the external nozzle. With such a buffing method, an effect same as the effect in Form 2 is attained. In this method, the supply of the process liquid through the internal supply line may be performed only in the step of performing the buffing or may be performed in both of the step of performing the buffing and the step of supplying the process liquid from the external nozzle. In the step of performing the buffing, the process liquid may be supplied from the external nozzle as well.

[Form 12]

According to a twelfth form of the present disclosure, there is provided a method for buffing a substrate with a buffing apparatus. The method includes: a step of disposing a substrate on a buff table for rotatably holding the substrate; a step of, before bringing a buff pad attached to a buff head, in which an internal supply line for supplying process liquid for buff process to the substrate is formed, into contact with the substrate, supplying the process liquid from an external nozzle in a state in which the rotation of the buff table is stopped; a step of, after the supply of the process liquid from the external nozzle is started, bringing the buff pad into contact with the substrate and starting the rotation of the buff table; and a step of performing the buffing while supplying the process liquid through the internal supply line after the step of starting the rotation of the buff table. With such a buffing method, an effect same as the effect in Form 6 is attained. In this method, the supply of the process liquid through the internal supply line may be performed only in the step of performing the buffing or may be performed in both of the step of performing the buffing and the step of supplying the process liquid from the external nozzle. In the step of performing the buffing, the treatment liquid may be supplied from the external nozzle as well.

[Form 13]

According to a thirteenth form of the present disclosure, there is provided a buffing apparatus for buffing a substrate. The buffing apparatus includes: a buff table for holding the substrate, the buff table being rotatable; a buff head to which a buff pad for buffing the substrate is attachable, the buff head being disposed above the buff table and configured to be rotatable; a process-liquid supplying section for supplying process liquid for the buffing to the substrate; and a wall section extending upward in a vertical direction over an entire circumferential direction on an outer side than a region for holding the substrate with the buff table, the wall section being capable of storing the process liquid in an inner side region of the wall section.

With such a buffing apparatus, it is possible to perform post process of the substrate treated by a chemical mechanical polishing apparatus. With the buffing apparatus, it is possible to perform finish polishing while suppressing damage to (a defect of) the substrate. Alternatively, it is possible to eliminate damage caused by the chemical mechanical polishing apparatus. Alternatively, compared with conventional roll cleaning and pen cleaning, it is possible to efficiently clean and remove foreign matters and the like having large adhesiveness. Moreover, with the buffing apparatus, since it is possible to perform the buffing in a state in which the treatment liquid is stored on the inner side region, it is possible to cause the process liquid to be surely present between the buff pad and the substrate. Therefore, it is possible to suppress a situation in which liquid film shortage occurs and the substrate is damaged. Compared with a configuration in which the process liquid limitlessly flows out to the outside from the substrate, it is possible to secure a high process rate while reducing a consumed amount of the process liquid. Note that, in this application, the expression "buffing the substrate" includes buffing only a specific part on the substrate besides buffing the entire substrate.

[Form 14]

According to a fourteenth form of the present disclosure, in Form 13, the buffing apparatus further includes a buff arm to which the buff head is rotatably attached, the buff arm being capable of moving the position of the buff head. The process-liquid supplying section includes a process liquid nozzle for supplying the process liquid and is configured such that the process liquid nozzle supplies the process liquid toward a region other than a moving track of the buff head. According to the Form 13, since it is possible to perform the buffing in a state in which the process liquid is stored in an inner side region, it is possible to supply the process liquid to any place in the inner side region. For example, liquid film shortage does not occur even if the process liquid is supplied to a place far from the buff pad. Therefore, as in the fourteenth form, it is possible to supply the process liquid toward the region avoiding the moving track of the buff head. According to such a Form 14, the process liquid supplied from the process-liquid supply section does not hit the buff arm or the buff head. Therefore, it is possible to suppress a situation in which the process liquid scatters and adheres to the buff arm or the buff head and an adhering object drops onto the substrate during the buffing to damage the substrate.

[Form 15]

According to a fifteenth form of the present disclosure, in Form 13 or Form 14, the process-liquid supplying section includes an internal supply line for the process liquid formed inside the buff head. The internal supply line is configured to supply the process liquid from an opening formed in the buff pad. According to such a form, the process liquid is supplied from the center of the buff pad via the internal supply line. Therefore, the process liquid can uniformly spread between the buff pad and the substrate with a centrifugal force and a supply pressure of the process liquid.

[Form 16]

According to a sixteenth form of the present disclosure, in any one of Form 13 to Form 15, the buffing apparatus includes a storage-amount adjusting section capable of adjusting an amount of the process liquid stored in the inner side region by adjusting an amount of the process liquid discharged from the inner side region. According to such a form, it is possible to flexibly perform the storage and the discharge of the process liquid according to a situation.

[Form 17]

In a seventeenth form of the present disclosure, in Form 16, the storage-amount adjusting section is configured to be capable of discharging an entire amount of the process liquid stored in the inner side region. According to such a form, it is possible to perform the buffing according to a situation without storing the process liquid in the inner side region. When the substrate and the buff table after the process are cleaned, it is possible to appropriately discharge cleaning water.

[Form 18]

According to an eighteenth form of the present disclosure, in Form 16 or Form 17, the storage-amount adjusting section includes a mechanism for causing at least a part of the wall section to perform a vertical motion, a horizontal motion, or a rotational motion. According to such a form, it is possible to suitably adjust an amount of the process liquid stored in the inner side region.

[Form 19]

According to a nineteenth form of the present disclosure, in any one of Form 16 to From 18, the storage-amount adjusting section includes: a discharge route capable of discharging the process liquid stored in the inner side region; and a valve capable of opening and closing the discharge route. According to such a form, it is possible to suitably adjust an amount of the process liquid stored in the inner side region.

[Form 20]

According to a twentieth form of the present disclosure, in any one of Form 16 to Form 19, the buffing apparatus further includes a control section configured to control the operation of the buffing apparatus. The control section is configured to determine on the basis of setting decided in advance whether the process liquid is stored in the inner side region. According to such a form, it is possible to switch, appropriately according to a situation, processing performed in a state in which the process liquid is stored in the inner side region and processing performed in a state in which the process liquid is not stored in the inner side region.

[Form 21]

According to a twenty-first form of the present disclosure, in any one of Form 16 to Form 19, the buffing apparatus further includes: a control section configured to control the operation of the buffing apparatus; and a sensor configured to detect a liquid surface level of the process liquid stored in the inner side region. The control section is configured to control, on the basis of a detection result of the sensor, the storage-amount adjusting section to adjust the liquid surface level of the process liquid to a set level. According to such a form, it is possible to store an appropriate amount of the process liquid in the inner side region according to a situation. For example, when the buff table is rotated at relatively high speed, the process liquid moves in the outer peripheral direction of the substrate with a centrifugal force and the liquid surface level near the outer periphery of the substrate easily rises. In such a case, it is possible to suppress scattering of the process liquid by detecting the liquid surface level near the outer periphery of the substrate with the sensor and lowering the liquid surface level with the storage-mount adjusting section.

[Form 22]

According to a twenty-second form of the present disclosure, in Form 20 or Form 21, the control section is configured to control the storage-amount adjusting section to discharge, at predetermined timing, an entire amount of the process liquid stored in the inner side region and store the process liquid supplied from the process-liquid supplying section anew. According to such a form, it is possible to discharge, together with the stored process liquid, a polishing product (a removed object) or a cleaning product (a removed object) generated by the buffing and continue the buffing using fresh process liquid not including these products. Therefore, it is possible to suppress the substrate from being damaged by these products.

[Form 23]

According to a twenty-third form of the present disclosure, in any one of Form 20 to Form 22, the control section is configured to control the buffing apparatus to continuously replace the process liquid stored in the inner side region by simultaneously performing the supply of the process liquid from the process-liquid supplying section and the discharge of a part of the process liquid stored in the inner side region. According to such a form, since the process liquid is continuously replaced, it is possible to suppress the polishing product or the cleaning product from being concentrated. It is possible to perform the buffing while performing the supply and the discharge of the process liquid. Therefore, a throughput is high.

[Form 24]

According to a twenty-fourth form of the present disclosure, in Form 20 or Form 21, the control section is configured to control the buffing apparatus to carry out, in a former period of the buffing, the buffing in a state in which the process liquid is stored in the inner side region and carry out, in a latter period of the buffing, the buffing after the process liquid stored in the inner side region is discharged. According to such a form, it is possible to rotate the buff table at relatively high speed to improve a polishing rate or a cleaning rate in the former period when the concentration of the polishing product or the cleaning product is relatively low and perform the buffing in a state which the process liquid including the product is discharged and prevent the substrate from being damaged in the latter period when the concentration of the products is relatively high. In the former period, since the buffing is performed in the state in which the process liquid is stored in the inner side region, even when the buff table is rotated at relatively high speed, it is possible to cause the process liquid to be uniformly present between the buff pad and the substrate.

[Form 25]

According to a twenty-fifth form of the present disclosure, in any one of Form 20 to Form 24, the control section is configured to control the buffing apparatus to store the process liquid in the inner side region before the start of the buffing. According to such a form, it is possible to spread a sufficient amount of the process liquid between the buff pad and the substrate at the start of the buffing when the process liquid tends to be insufficient between the buff pad and the substrate. Therefore, it is possible to suppress the substrate from being damaged. Moreover, compared with a configuration not including the wall section (i.e., a configuration in which the supplied process liquid flows out without being dammed), it is possible to reduce time in which the process liquid is preloaded (supplied beforehand) and a throughput is improved.

[Form 26]

According to a twenty-sixth form of the present disclosure, in any one of Form 13 to Form 27, the buffing apparatus further includes a cleaning-liquid supplying section for supplying the cleaning liquid into the inner side region. According to such a form, it is possible to wash away the process liquid adhering to the wall section by discharging the cleaning liquid after storing the cleaning liquid in the inner side region. Therefore, it is possible to suppress the process liquid adhering to the wall section from adversely affecting the substrate.

[Form 27]

According to a twenty-seventh form of the present disclosure, in any one of Form 13 to Form 26, the buffing apparatus further includes a nozzle mechanism capable of jetting the cleaning liquid toward the wall section. According to such a form, it is possible to efficiently wash away the process liquid adhering to the wall section.

[Form 28]

According to a twenty-eighth form of the present disclosure, in any one of Form 13 to Form 27, the buffing apparatus further includes a temperature adjusting section capable of adjusting the temperature of the process liquid stored in the inner side region of the wall section. According to such a form, it is possible to optimize process performance of the buffing in terms of a temperature condition.

[Form 29]

According to a twenty-ninth form of the present disclosure, there is provided a substrate processing apparatus. The substrate processing apparatus includes: a chemical mechanical polishing apparatus; and the buffing apparatus according to any one of Form 13 to Form 28 for performing post process of a substrate treated by the chemical mechanical polishing apparatus. With such a substrate processing apparatus, an effect same as the effect of any one of Form 13 to Form 28 is attained.

[Form 30]

According to a thirtieth form of the present disclosure, there is provided a buffing method for buffing a substrate. The buffing method includes: a step of disposing the substrate on a buff table; a step of storing process liquid in an inner side region of a wall section extending upward in a vertical direction over an entire circumferential direction on an outer side than a disposed region of the substrate; and a step of buffing the substrate disposed on the buff table in a state in which the process liquid is stored in the inner side region. With such a buffing method, an effect same as the effect in the Form 13 is attained.

BRIEF DESCRIPTION OF DRAWINGS

FIG. 17A is a schematic diagram showing an example of a structure for discharging process liquid;

FIG. 17B is a schematic diagram showing another example of the structure for discharging process liquid;

FIG. 17C is a schematic diagram showing another example of the structure for discharging process liquid;

FIG. 17D is a schematic diagram showing another example of the structure for discharging process liquid;

FIG. 17E is a schematic diagram showing another example of the structure for discharging process liquid;

DESCRIPTION OF EMBODIMENTS

A burring apparatus and a substrate processing apparatus according to an embodiment of the present disclosure are explained below with reference to FIG. 1 to FIG. 10.

A. EXAMPLES

Figure 1:
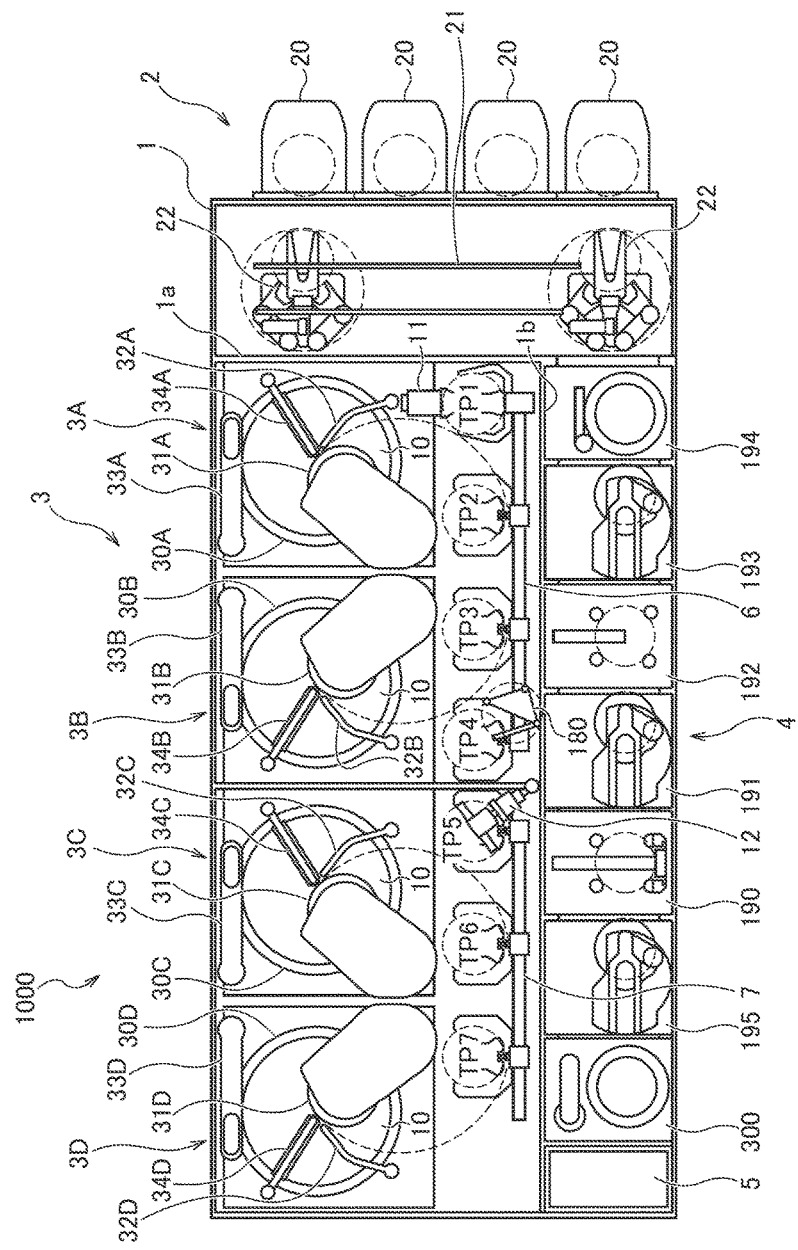
FIG. 1 is a schematic plan view showing the entire configuration of a substrate processing apparatus according to an example of the present disclosure.

FIG. 1 is a plan view showing the overall configuration of a substrate processing apparatus according to an embodiment of the present disclosure. As shown in FIG. 1, a substrate processing apparatus 1000 includes a substantially rectangular housing 1. The inside of the housing 1 is divided into a load/unload unit 2, a polishing unit 3, and a cleaning unit 4 by partition walls 1a and 1b. The load/unload unit 2, the polishing unit 3, and the cleaning unit 4 are assembled independently from one another and exhausted independently from one another. The cleaning unit 4 includes a power supply section (not shown) that supplies electric power to the substrate processing apparatus and a control device 5 that controls a substrate processing operation.

The load/unload unit 2 includes two or more (in this embodiment, four) front load sections 20 on which wafer cassettes for stocking a large number of wafers (substrates) are placed. The front load sections 20 are disposed adjacent to the housing 1 and arrayed along the width direction (a direction perpendicular to the longitudinal direction) of the substrate processing apparatus. The front load sections 20 are configured such that an open cassette, an SMIF (Standard Manufacturing Interface) pod, or an FOUP (Front Opening Unified Pod) can be mounted on the front load sections 20.

In the load/unload unit 2, a traveling mechanism 21 is disposed along the arrangement of the front load sections 20. On the traveling mechanism 21, two conveying robots 22 capable of moving along an arraying direction of the wafer cassettes are set. The conveying robots 22 are configured to be capable of accessing the wafer cassettes mounted on the front load sections 20 by moving on the traveling mechanism 21. Each conveying robot 22 takes out the wafer before process from the wafer cassette and returns the treated wafer to the wafer cassette.

The polishing unit 3 is a region where polishing (flattening) of the wafers is performed. The polishing unit 3 includes a first polishing unit 3A, a second polishing unit 3B, a third polishing unit 3C, and a fourth polishing unit 3D. The polishing units 3A to 3D are arrayed along the longitudinal direction of the substrate processing apparatus as shown in FIG. 1.

As shown in FIG. 1, the first polishing unit 3A includes a polishing table 30A to which a polishing pad 10 including a polishing surface is attached, a top ring 31A for polishing a wafer while holding the wafer and pressing the wafer against the polishing pad 10 on the polishing table 30A, a polishing-liquid supply nozzle 32A for supplying polishing liquid and dressing liquid (e.g., pure water) to the polishing pad 10, a dresser 33A for performing dressing of the polishing surface of the polishing pad 10, and an atomizer 34A that changes mixed fluid of liquid (e.g., pure water) and gas (e.g., nitrogen gas) or the liquid (e.g., pure water) to a mist state and jets the mixed fluid or the liquid onto the polishing surface.

Similarly, the second polishing unit 3B includes a polishing table 30B, a top ring 31B, a polishing-liquid supply nozzle 32B, a dresser 33B, and an atomizer 34B. The third polishing unit 3C includes a polishing table 30C, a top ring 31C, a polishing-liquid supply nozzle 32C, a dresser 33C, and an atomizer 34C. The fourth polishing unit 3D includes a polishing table 30D, a top ring 31D, a polishing-liquid supply nozzle 32D, a dresser 33D, and an atomizer 34D.

The first polishing unit 3A, the second polishing unit 3B, the third polishing unit 3C, and the fourth polishing unit 3D have the same configuration together. Therefore, only the first polishing unit 3A is explained below.

Figure 2:
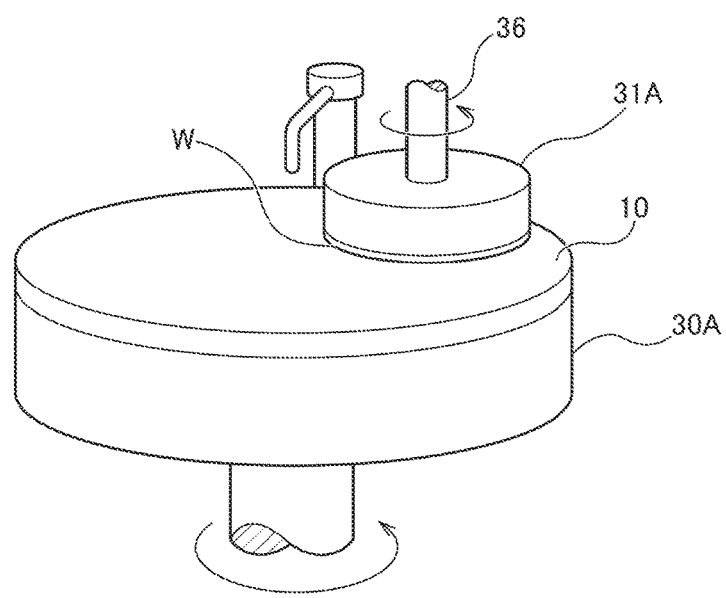
FIG. 2 is a perspective view schematically showing a polishing unit.

FIG. 2 is a perspective view schematically showing the first polishing unit 3A. The top ring 31A is supported by a top ring shaft 36. The polishing pad 10 is stuck to the upper surface of the polishing table 30A. The upper surface of the polishing pad 10 forms a polishing surface for polishing a wafer W. Note that fixed abrasive grains can also be used instead of the polishing pad 10. The top ring 31A and the polishing table 30A are configured to rotate around the axes thereof as indicated by arrows. The wafer W is held on the lower surface of the top ring 31A by vacuum attraction. During polishing, the polishing liquid is supplied from the polishing-liquid supply nozzle 32A to the polishing surface of the polishing pad 10. The wafer W, which is a polishing target, is pressed against the polishing surface by the top ring 31A and polished.

Next, a conveying mechanism for conveying a wafer is explained. As shown in FIG. 1, a first linear transporter 6 is disposed adjacent to the first polishing unit 3A and the second polishing unit 3B. The first linear transporter 6 is a mechanism for conveying a wafer among four conveying positions (a first conveying position TP1, a second conveying position TP2, a third conveying position TP3, and a fourth conveying position TP4 in order from the load/unload unit side) along a direction in which the polishing units 3A and 3B are arrayed.

A second linear transporter 7 is disposed adjacent to the third polishing unit 3C and the fourth polishing unit 3D. The second linear transporter 7 is a mechanism for conveying a wafer among three conveying positions (a fifth conveying position TP5, a sixth conveying position TP6, and a seventh conveying position TP7 in order from the load/unload unit side) along a direction in which the polishing units 3C and 3D are arrayed.

The wafer is conveyed to the polishing units 3A and 3B by the first linear transporter 6. The top ring 31A of the first polishing unit 3A moves between a polishing position and the second conveying position TP2 according to a swing action of the top ring head. Therefore, transfer of the wafer to the top ring 31A is performed in the second conveying position TP2. Similarly, the top ring 31B of the second polishing unit 3B moves between the polishing position and the third conveying position TP3. Transfer of the wafer to the top ring 31B is performed in the third conveying position TP3. The top ring 31C of the third polishing unit 3C moves between the polishing position and the sixth conveying position TP6. Transfer of the wafer to the top ring 31C is performed in the sixth conveying position TP6. The top ring 31D of the fourth polishing unit 3D moves between the polishing position and the seventh conveying position TP7. Transfer of the wafer to the top ring 31D is performed in the seventh conveying position TP7.

In the first conveying position TP1, a lifter 11 for receiving the wafer from the conveying robots 22 is disposed. The wafer is passed from the conveying robots 22 to the first linear transporter 6 via the lifter 11. A swing transporter 12 is disposed among the first linear transporter 6, the second linear transporter 7, and the cleaning unit 4. The swing transporter 12 includes a hand capable of moving between the fourth conveying position TP4 and the fifth conveying position TP5. Transfer of the wafer from the first linear transporter 6 to the second linear transporter 7 is performed by the swing transporter 12. The wafer is conveyed to the third polishing unit 3C and/or the fourth polishing unit 3D by the second linear transporter 7. The wafer polished by the polishing unit 3 is conveyed to a temporary placing table 180 by the swing transporter 12. The wafer placed on the temporary placing table 180 is conveyed to the cleaning unit 4.

Figure 3A:
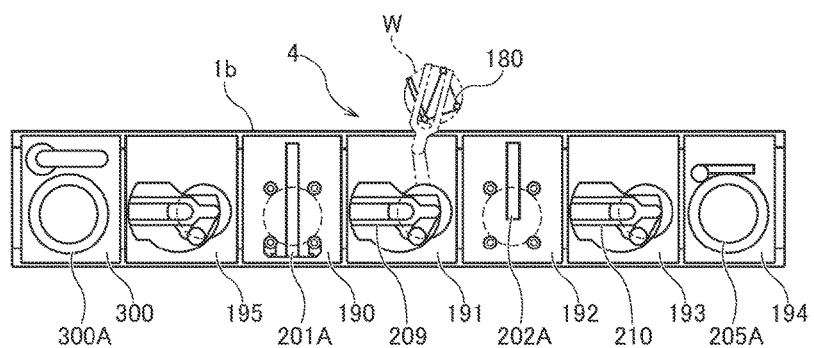
FIG. 3A is a schematic plan view of a cleaning unit.
Figure 3B:
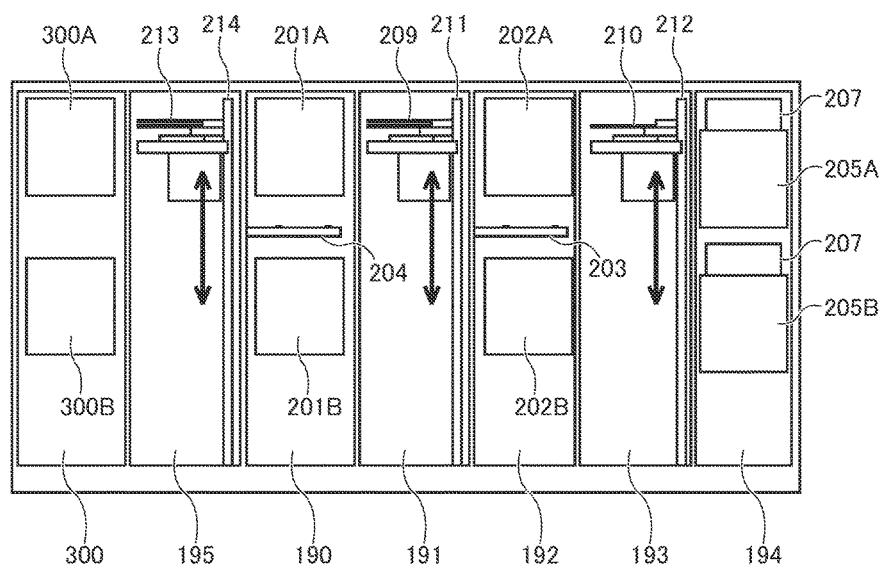
FIG. 3B is a schematic side view of the cleaning unit.

FIG. 3A is a plan view showing the cleaning unit 4. FIG. 3B is a side view showing the cleaning unit 4. As shown in FIG. 3A and FIG. 3B, the cleaning unit 4 is divided into a roll cleaning chamber 190, a first conveying chamber 191, a pen cleaning chamber 192, a second conveying chamber 193, a drying chamber 194, a buffing chamber 300, and a third conveying chamber 195.

In the roll cleaning chamber 190, an upper roll cleaning module 201A and a lower roll cleaning module 201B arrayed along the longitudinal direction are disposed. The upper roll cleaning module 201A is disposed above the lower roll cleaning module 201B. The upper roll cleaning module 201A and the lower roll cleaning module 201B are cleaning machines that clean a wafer by pressing two rotating roll sponges respectively against the front and rear surfaces of the wafer while supplying cleaning liquid to the front and rear surfaces of the wafer. A temporary placing table 204 for the wafer is provided between the upper roll cleaning module 201A and the lower roll cleaning module 201B.

In the pen cleaning chamber 192, an upper pen cleaning module 202A and a lower pen cleaning module 202B arrayed along the longitudinal direction are disposed. The upper pen cleaning module 202A is disposed above the lower pen cleaning module 202B. The upper pen cleaning module 202A and the lower pen cleaning module 202B are cleaning machines that clean a wafer by pressing a rotating pensile sponge against the surface of the wafer and swinging in the radial direction of the wafer while supplying the cleaning liquid to the surface of the wafer. A temporary placing table 203 for the wafer is provided between the upper pen cleaning module 202A and the lower pen cleaning module 202B.

In the drying chamber 194, an upper drying module 205A and a lower drying module 205B arrayed along the longitudinal direction are disposed. The upper drying module 205A and the lower drying module 205B are separated from each other. In upper parts of the upper drying module 205A and the lower drying module 205B, fan filter units 207, 207 that respectively supply clean air into the drying modules 205A and 205B are provided.

In the first conveying chamber 191, a first conveying robot (conveying mechanism) 209 movable up and down is disposed. In the second conveying chamber 193, a second conveying robot 210 movable up and down is disposed. In the third conveying chamber 195, a third conveying robot (conveying mechanism) 213 movable up and down is disposed. The first conveying robot 209, the second conveying robot 210, and the third conveying robot 213 are respectively movably supported by supporting shafts 211, 212, and 214 extending in the longitudinal direction. The first conveying robot 209, the second conveying robot 210, and the third conveying robot 213 include driving mechanisms such as motors inside and are configured to be movable up and down along the supporting shafts 211, 212, and 214. The first conveying robot 209 includes hands in two upper and lower stages. As indicated by a dotted line in FIG. 3A, the first conveying robot 209 is disposed in a position where the hand on the lower side of the first conveying robot 209 is accessible to the temporary placing table 180.

The first conveying robot 209 operates to convey the wafer W among the temporary placing table 180, the upper roll cleaning module 201A, the lower roll cleaning module 201B, the temporary placing table 204, the temporary placing table 203, the upper pen cleaning module 202A, and the lower pen cleaning module 202B. When conveying a wafer before cleaning (a wafer to which slurry adheres), the first conveying robot 209 uses the hand on the lower side. When conveying the wafer after cleaning, the first conveying robot 209 uses the hand on the upper side.

The second conveying robot 210 operates to convey the wafer W among the upper pen cleaning module 202A, the lower pen cleaning module 202B, the temporary placing table 203, the upper drying module 205A, and the lower drying module 205B. Since the second conveying robot 210 conveys only the cleaned wafer, the second conveying robot 210 includes only one hand. The conveying robots 22 shown in FIG. 1 take out a wafer from the upper drying module 205A or the lower drying module 205B and return the wafer to the wafer cassette using the hand on the upper side.

In the buffing chamber 300, an upper buffing module 300A and a lower buffing module 300B are provided. The third conveying robot 213 operates to convey the wafer W among the upper roll cleaning module 201A, the lower roll cleaning module 201B, the temporary placing table 204, the upper buffing module 300A, and the lower buffing module 300B.

In this embodiment, an example is explained in which, in the cleaning unit 4, the buffing chamber 300, the roll cleaning chamber 190, and the pen cleaning chamber 192 are disposed to be arranged in order from a far side of the load/unload unit 2. However, not limited to this, but a disposition form of the buffing chamber 300, the roll cleaning chamber 190, and the pen cleaning chamber 192 can be selected as appropriate according to the quality of wafers, the throughput, and the like. The upper buffing module 300A and the lower buffing module 300B have the same configuration. Therefore, in the following explanation, only the upper buffing module 300A is explained.

Figure 4:
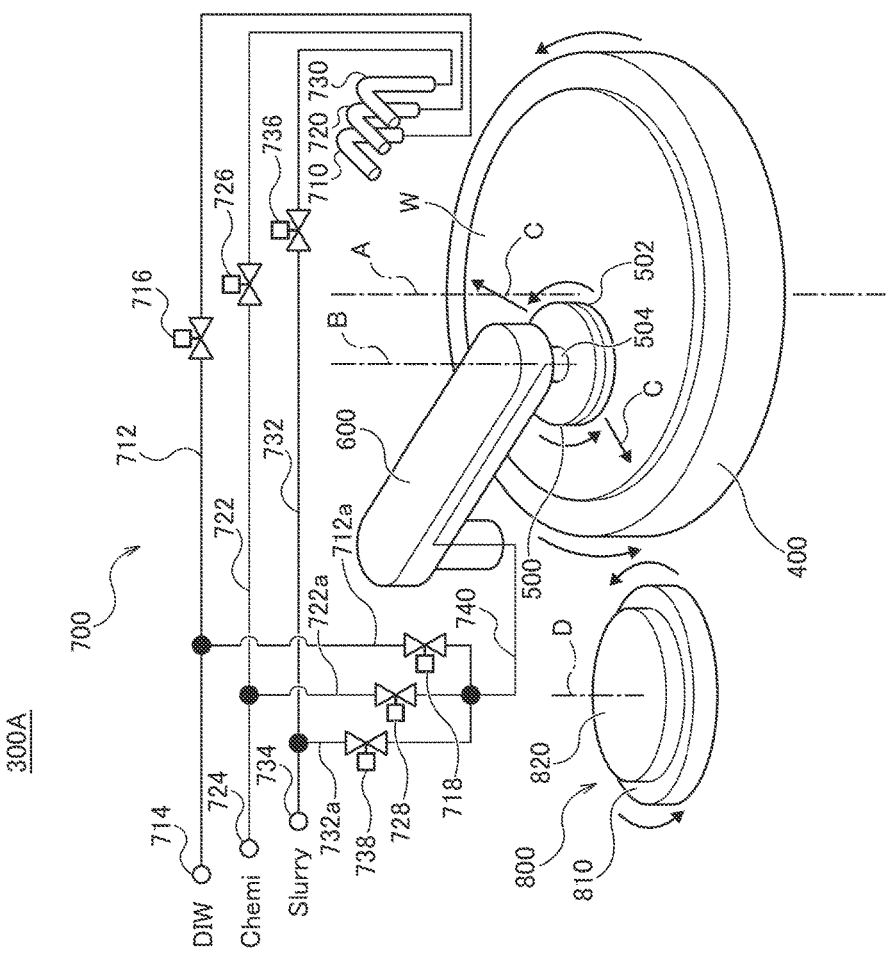
FIG. 4 is a diagram showing the schematic configuration of a buffing module.

FIG. 4 is a diagram showing the schematic configuration of the upper buffing module. As shown in FIG. 4, the buffing module 300A includes a buff table 400 for holding the wafer W functioning as a type of the substrate, a buff head 500 to which a buff pad 502 for buffing a process surface of the wafer W is attached, a buff arm 600 for holding the buff head 500, a liquid supply system 700 for supplying various kinds of process liquid, and a conditioning section 800 for performing conditioning (dressing) of the buff pad 502.

The buff table 400 includes a mechanism for holding the wafer W. In this example, the wafer holding mechanism is a vacuum attraction system. However, the wafer holding mechanism can be any system. For example, the wafer holding mechanism may be a clamp system for clamping the front surface and the rear surface of the wafer W in at least one place in the peripheral edge portion of the wafer W or may be a roller chuck system for holding the side surface of the wafer W in at least one place of the peripheral edge portion of the wafer W. In this example, the buff table 400 holds the wafer W such that the process surface of the wafer W faces upward.

The buff table 400 is configured to rotate around a rotation axis A with a not-shown driving mechanism. The buff head 500 is attached to the buff arm 600 via a shaft 504 configured to be rotatable. The buff pad 502 for buffing the wafer W is attached to a surface of the buff head 500 opposed to the wafer W (or the buff table 400). The buff arm 600 is configured to rotate the buff head 500 around a rotation axis B. The area of the buff pad 502 is smaller than the area of the wafer W (or the buff table 400). Therefore, the buff arm 600 is configured to be capable of swinging the buff head 500 in the radial direction of the wafer W as indicated by an arrow C such that the wafer W can be uniformly buffed. The buff arm 600 is configured to be capable of swinging the buff head 500 to a position where the buff pad 502 is opposed to the conditioning section 800. The buff head 500 is configured to be movable in a direction approaching the buff table 400 and a direction away from the buff table 400 (in this example, up and down) with an actuator (not shown). Consequently, it is possible to press the buff pad 502 against the wafer W with a predetermined pressure. Such a configuration may be realized by a telescopic motion of the shaft 504 or may be realized by an upward and downward motion of the buff arm 600.

The liquid supply system 700 includes a pure-water external nozzle 710 for supplying pure water (in the figure, represented as DIW) to the process surface of the wafer W. The pure-water external nozzle 710 is connected to a pure-water supply source 714 via a pure water pipe 712. In the pure water pipe 712, an opening and closing valve 716 capable of opening and closing the pure water pipe 712 is provided. The control device 5 can supply the pure water to the process surface of the wafer W at any timing by controlling opening and closing of the opening and closing valve 716.

The liquid supply system 700 includes a chemical external nozzle 720 for supplying a chemical (in the figure, represented as Chemi) to the process surface of the wafer W. The chemical external nozzle 720 is connected to a chemical supply source 724 via a chemical pipe 722. In the chemical pipe 722, an opening and closing valve 726 capable of opening and closing the chemical pipe 722 is provided. The control device 5 can supply the chemical to the process surface of the wafer W at any timing by controlling opening and closing of the opening and closing valve 726.

The liquid supply system 700 includes a slurry external nozzle 730 for supplying slurry (in the figure, represented as Slurry) to the process surface of the wafer W. The slurry external nozzle 730 is connected to a slurry supply source 734 via a slurry pipe 732. In the slurry pipe 732, an opening and closing valve 736 capable of opening and closing the slurry pipe 732 is provided. The control device 5 can supply the slurry to the process surface of the wafer W at any timing by controlling opening and closing of the opening and closing valve 736.

In this example, the positions of all of the external nozzles 710, 720, and 730 are fixed. The external nozzles 710, 720, and 730 supply pure water, a chemical, or slurry toward a fixed position set in advance. These kinds of process liquid are supplied to a position in which the process liquid is efficiently supplied to the buff pad 502 by the rotation of the wafer W. The external nozzles 710, 720, and 730 may be configured as one or two nozzles common to two or more of the kinds of process liquids. The external nozzles may be configured to supply at least one kind of process liquid among the pure water, the chemical, and the slurry.

The buffing module 300A is further configured to be capable of selectively supplying the process liquid (the pure water, the chemical, or the slurry) to the process surface of the wafer W via the buff arm 600, the buff head 500, and the buff pad 502. That is, a branching pure water pipe 712*a* branches from between the pure-water supply source 714 and the opening and closing valve 716 in the pure water pipe 712. Similarly, a branching chemical pipe 722*a* branches from between a chemical supply source 724 and an opening and closing valve 726 in a chemical pipe 722. A branching slurry pipe 732*a* branches from between a slurry supply source 734 and an opening and closing valve 736 in a slurry pipe 732. The branching pure water pipe 712*a*, the branching chemical pipe 722*a*, and the branching slurry pipe 732*a* merge into the liquid supply pipe 740. In the branching pure water pipe 712*a*, an opening and closing valve 718 capable of opening and closing the branching pure water pipe 712*a* is provided. In the branching chemical pipe 722*a*, an opening and closing valve 728 capable of opening and closing the branching chemical pipe 722*a* is provided. In the branching slurry pipe 732*a*, an opening and closing valve 738 capable of opening and closing the branching slurry pipe 732*a* is provided.

Figure 5:
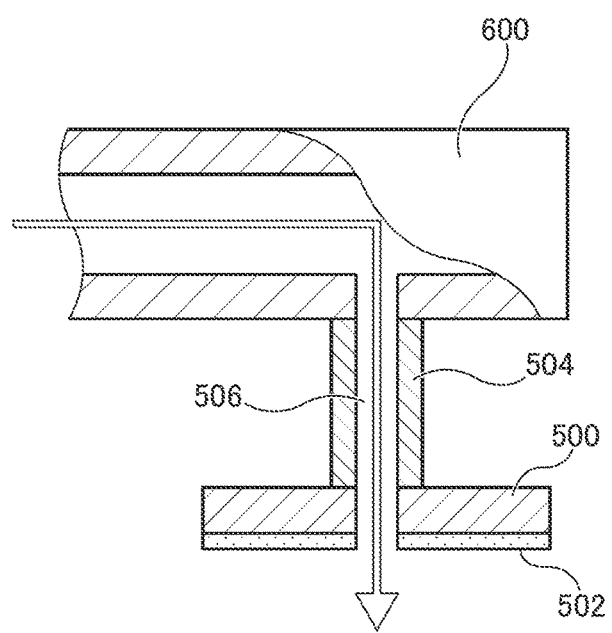
FIG. 5 is a schematic diagram showing the internal configuration of a buff head.

The liquid supply pipe 740 communicates with the inside of the buff arm 600, the center inside of the buff head 500, and the center inside of the buff pad 502. Specifically, as shown in FIG. 5, an internal supply line 506 is formed inside the buff arm 600, the buff head 500, and the buff pad 502. The internal supply line 506 communicates with the liquid supply pipe 740. The internal supply line 506 opens toward the upper surface of the buff table 400 (the process surface of the wafer W). In this example, only one opening of the internal supply line 506 is provided in the center of the buff pad 502. However, a plurality of openings may be provided. For example, the internal supply line 506 may branch toward a plurality of distributed openings through a water pool jacket structure formed in the buff head 500. The plurality of openings may be distributed such that the positions in the radial directions thereof are different. The control device 5 can supply any one of pure water, a chemical, and slurry or mixed liquid of any combination thereof to the process surface of the wafer W at any timing by controlling the opening and closing of the opening and closing valve 718, the opening and closing valve 728, and the opening and closing valve 738. As it is evident from the above explanation, the buffing module 300A includes the process liquid supplying means of the two systems, i.e., the external nozzles 710, 720, and 730 and the internal supply line 506.

The buffing module 300A can buff the wafer W by supplying the process liquid to the wafer W via at least one of the external nozzles 710, 720, and 730 and the internal supply line 506 and rotating the buff table 400 around the rotation axis A, pressing the buff pad 502 against the process surface of the wafer W, and swinging the buff head 500 in the arrow C direction while rotating the buff head 500 around the rotation axis B. Note that the relative motion of the buff table 400 and the buff head 500 in the buffing is not limited to the example explained above and may be realized by at least one of a rotational motion, a translational motion, an arcuate motion, a reciprocating motion, a scroll motion, and an angle rotational motion (a motion for rotating by a predetermined angle smaller than 360 degrees).

In this application, the buffing includes at least one of buff polishing and buff cleaning. The buff polishing is process for, while bringing the buff pad 502 into contact with the wafer W, relatively moving the wafer W and the buff pad 502 and interposing slurry between the wafer W and the buff pad 502 to thereby polish and remove the process surface of the wafer W. The buff polishing is usually process for performing so-called finish polishing after main polishing performed for the purpose of planarizing unevenness of the surface of the wafer and removing an excess film formed on surfaces other than insides of trenches and vias. A removal processing amount of the buff polishing is, for example, approximately several nanometers to ten and a few nanometers. As the buff pad 502, for example, a pad obtained by stacking foaming polyurethane and nonwoven fabric (specifically, for example, IC1000 (R)/SUBA (R)-based pad) and a suede-like porous polyurethane non-fibrous pad (specifically, for example, commercially available POLITEX (R)) can be used. The buff polishing is process with which a physical acting force stronger than a physical acting force applied to the wafer W by a roll sponge made of PVA in the roll cleaning chamber 190 and a physical acting force applied to the wafer W by a pen sponge made of PVA in the pen cleaning chamber 192 can be applied to the wafer W. With the buff polishing, it is possible to realize removal of a surface layer portion having damage such as scratches or a surface layer portion to which foreign matters adhere, additional removal of a part that cannot be removed by the main polishing in the polishing unit 3, or improvement of morphology such as unevenness of a very small region and a film thickness distribution over the entire substrate after the main polishing can be realized.

The buff cleaning is finish process for relatively moving the wafer W and the buff pad 502 while bringing the buff pad 502 into contact with the wafer W and interposing cleaning process liquid (a chemical, pure water, or mixture of the chemical and the pure water) between the wafer W and the buff pad 502 to thereby remove foreign matters on the surface of the wafer W and reforming the process surface. As the buff pad 502, the IC1000 (R)/SUBA (R)-based pad, POLITEX (R), or the like is used. The buff cleaning is processing with which a physical acting force stronger than a physical acting force applied to the wafer W by a roll sponge mad of PVA in the roll cleaning chamber 190 and a physical acting force applied to the wafer W by a pen sponge made of PVA in the pen cleaning chamber 192 can be applied to the wafer W. With the buff cleaning, it is possible to efficiently clean and remove, for example, foreign matters having large adhesiveness that cannot be removed by simply bringing a sponge material made of PVA into contact with the wafer W. For the buff cleaning in the present disclosure, it is also possible to use a PVA sponge as the buff pad.

The conditioning section 800 is a member for conditioning (dressing) the surface of the buff pad 502. In this example, the conditioning section 800 is disposed outside the buff table 400. As an alternative form, the conditioning section 800 may move to above the buff table 400 and below the buff head 500 and perform conditioning of the buff pad 502. In this case, the conditioning is desirably performed after the treated wafer W is taken out. The conditioning section 800 includes a dress table 810 and a dresser 820 set on the dress table 810. The dress table 810 is configured to be capable of rotating around a rotation axis D with a not-shown driving mechanism. The dresser 820 is formed of, for example, a diamond dresser, a brush dresser, or a combination of the diamond dresser and the brush dresser.

When performing the conditioning of the buff pad 502, the buffing module 300A turns the buff arm 600 to a position where the buff pad 502 is opposed to the dresser 820. The buffing module 300A performs the conditioning of the buff pad 502 by rotating the dress table 810 around the rotation axis D and rotating the buff head 500 and pressing the buff pad 502 against the dresser 820. Such a conditioning operation can be performed, for example, while the buffed wafer W is replaced with the wafer W that should be buffed next.

With the buffing module 300A explained above, by performing the buffing as post process of the wafer W subjected to chemical mechanical polishing, it is possible to perform finish polishing while suppressing damage to (a defect of) the wafer W or remove damage that occurs in the chemical mechanical polishing. Alternatively, compared with the conventional roll cleaning and the conventional pen cleaning, it is possible to efficiently clean and remove, for example, foreign matters having large adhesiveness. In particular, in this example, the process liquid is preloaded (supplied beforehand) before the buffing is started such that damage to the wafer W can be suppressed. If the process liquid is not sufficiently present between the wafer W and the buff pad 502 at the start of the buffing, it is likely that damage such as scratches occurs in the wafer W. Therefore, the preload of the process liquid is performed to prevent process liquid insufficiency from occurring such that a sufficient amount of the process liquid is present at least between the buff pad 502 and the wafer W at the start of the buffing. Such a supply form of the process liquid is explained below.

Figure 6A:
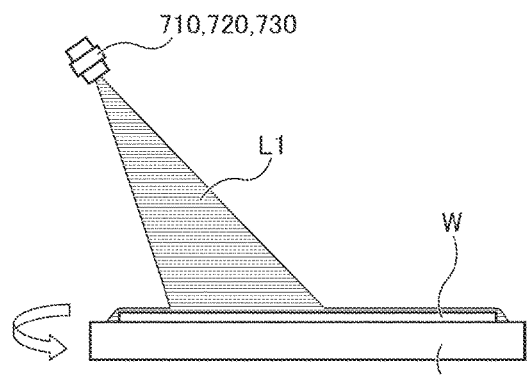
FIG. 6A is a schematic diagram showing a first example of a procedure of preload of process liquid in buffing.
Figure 6B:
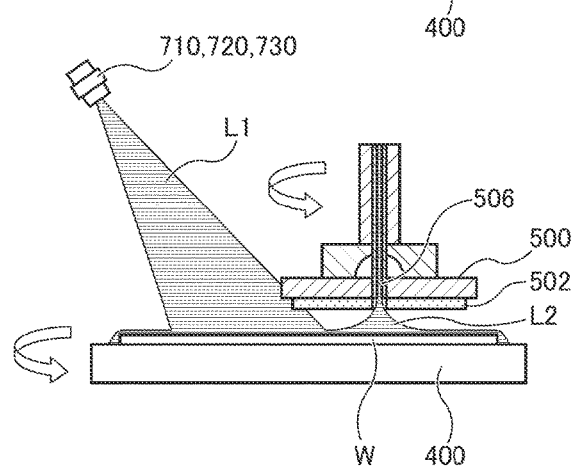
FIG. 6B is a schematic diagram showing the first example of the procedure of preload of process liquid in buffing.
Figure 6C:
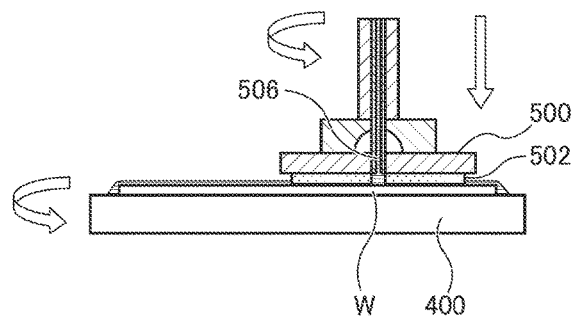
FIG. 6C is a schematic diagram showing the first example of the procedure of preload of process liquid in buffing.

FIGS. 6A to 6C are schematic diagrams showing a first example of a procedure of the preload of the process liquid in the buffing. In this example, this procedure is realized by the control device 5 controlling the operation of the buffing module 300A. The buffing module 300A may be controlled by a control module exclusive for the buffing module 300A instead of the control device 5. In this example, first, as shown in FIG. 6A, first, before the buff head 500 moves from a position to which the buff pad 502 rises upward not to come into contact with the wafer W (hereinafter also referred to as rising position) to a position for bringing the buff pad 502 into contact with the wafer W (hereinafter also referred to as contact position) (i.e., before the start of movement and/or during the movement), in a state in which the buff table 400 rotates, process liquid L1 is supplied from at least one of the external nozzles 710, 720, and 730 onto the wafer W. Since the process liquid L1 is supplied in the state in which the buff table 400 rotates, the process liquid L1 can uniformly spread on the wafer W. Therefore, a supply part of the process liquid L1 on the wafer W may be optionally set.

Subsequently, after the process liquid L1 uniformly spreads over the wafer W, the buff head 500 is moved (lowered) to a contact position. During this moving action, as shown in FIG. 6B, process liquid L2 is supplied through the internal supply line 506 formed inside the buff pad 502 onto the wafer W. In this case, the process liquid L1 is also supplied from at least one of the external nozzles 710, 720, and 730. With such a configuration, when the wafer W and the buff pad 502 come into contact with each other and the buffing is started, the buffing can be started in a state in which the process liquid is sufficiently present between the wafer W and the buff pad 502. A supply amount of the process liquid increases according to the supply of the process liquid L1 and L2 from the two systems. Therefore, it is possible to more uniformly supply the process liquid to the process surface of the wafer W. Further, in this example, as shown in FIG. 6B, the buff head 500 is moved downward while rotating. With such a configuration, since the buffing can be started simultaneously with the buff head 500 reaching the contact position, it is possible to improve a throughput. However, the buff head 500 may start the rotation after reaching the contact position.

As shown in FIG. 6C, when the buff head 500 reaches the contact position, a pressing force is applied to the wafer W from the buff head 500, and the buffing is started, the buffing is carried out in a state in which the supply of the process liquid L1 from at least one of the external nozzles 710, 720, and 730 is stopped and the process liquid L2 is supplied through only the internal supply line 506. With such a configuration, at the start of the buffing when damage to the substrate easily occurs, the process liquid L1 and L2 are supplied from the two systems beforehand. Thereafter, the process liquid is stably present between the wafer W and the buff pad 502 and the buffing also stabilizes. Therefore, since the process liquid L2 is supplied only through the internal supply line 506, it is possible to reduce an amount of use of the process liquid while suppressing damage to the wafer W. The process liquid L2 is supplied from the center of the buff pad 502 via the internal supply line 506. Therefore, the process liquid L2 can uniformly spread between the buff pad 502 and the wafer W with a centrifugal force and a supply pressure of the process liquid L2. Instead of the configuration explained above, timing for stopping the supply of the process liquid L1 may be after the elapse of a predetermined time from the start of the buffing.

As an alternative form, during the buffing, the process liquid L1 and L2 may be always supplied from both of at least one of the external nozzles 710, 720, and 730 and the internal supply line 506. With such a configuration, it is possible to effectively suppress occurrence of insufficiency of the process liquid during the buffing.

Figure 7A:
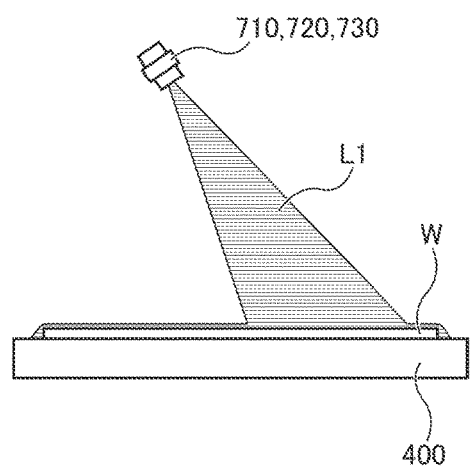
FIG. 7A is a schematic diagram showing a second example of a procedure of preload of process liquid in buffing.
Figure 7B:
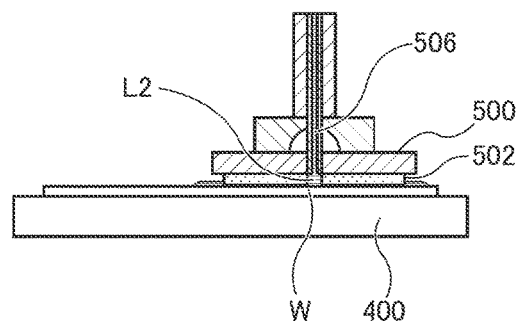
FIG. 7B is a schematic diagram showing the second example of the procedure of preload of process liquid in buffing.
Figure 7C:
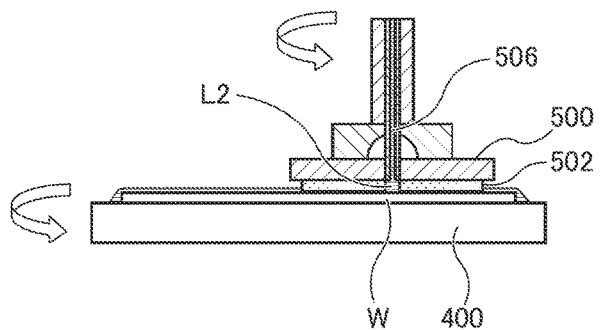
FIG. 7C is a schematic diagram showing the second example of the procedure of preload of process liquid in buffing.

FIGS. 7A to 7C are schematic diagrams showing a second example of the procedure of the preload of the process liquid in the buffing. In this example, as shown in FIG. 7A, first, before the buff head 500 moves from a retracted position to the contact position, in a state in which the rotation of the buff table 400 is stopped, the process liquid L1 is supplied onto the wafer W from at least one of the external nozzles 710, 720, and 730. Since the buff table 400 is not rotating, the supplied process liquid L1 generally accumulates around a region to which the process liquid L1 is supplied. Therefore, the process liquid L1 is supplied toward a position to which the buff head 500 is lowered, that is, a position where the buff pad 502 comes into contact with the wafer W first.

Thereafter, the supply of the process liquid L1 is stopped and the buff head 500 is moved from the retracted position to the contact position. When the buff head 500 is moved to the contact position, as shown in FIG. 7B, the supply of the process liquid L2 through the internal supply line 506 is started. Subsequently, when the rotation of the buff table 400 and the buff head 500 is started, the buffing is started. During the buffing, as shown in FIG. 7C, the process liquid L2 is supplied through only the internal supply line 506 and the process liquid L1 is not supplied from at least one of the external nozzles 710, 720, and 730. With such a configuration, it is possible to efficiently preload the process liquid to the region of the wafer W in contact with the buff pad 502. That is, it is possible to reduce an amount of use of the process liquid.

Like the procedure shown in FIG. 6A to FIG. 6C, various modifications of the procedure shown in FIG. 7A to FIG. 7C are possible. For example, the process liquid L2 may be supplied through the internal supply line 506 onto the wafer W while the buff head 500 moves from the rising position to the contact position. Alternatively, during the buffing, in addition to the process liquid L2 supplied through the internal supply line 506, the process liquid L1 may be supplied from at least one of the external nozzles 710, 720, and 730. Alternatively, the buff head 500 may be moved to the contact position while rotating.

By performing the preload of the process liquid by using the external nozzles 710, 720, and 730 rather than using the internal supply line 506 as in the first example and the second example explained above, it is possible to improve a throughput. Specifically, according to the first or second example, when the buff head 500 is dressed in the dresser 820 of the conditioning section 800 disposed outside the buff table 400, it is possible to preload the process liquid L1 onto the wafer W from the external nozzles 710, 720, and 730 during the dressing and during the movement of the buff head 500 from the conditioning section 800 to the rising position. Therefore, compared with when the buff head 500 is moved onto the wafer W from the dresser 820 and thereafter starting the buffing after preloading the process liquid L2 using only the internal supply line 506, there is no standby time for the preload. Therefore, it is possible to improve a throughput.

Figure 8A:
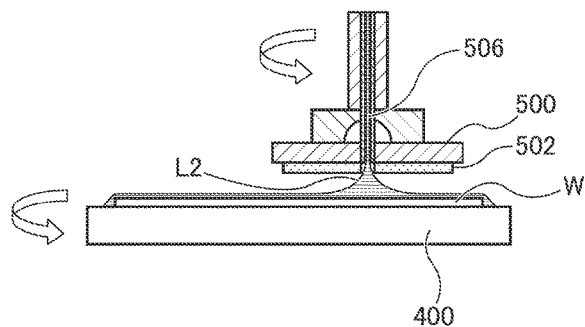
FIG. 8A is a schematic diagram showing a third example of a procedure of preload of process liquid in buffing.
Figure 8B:
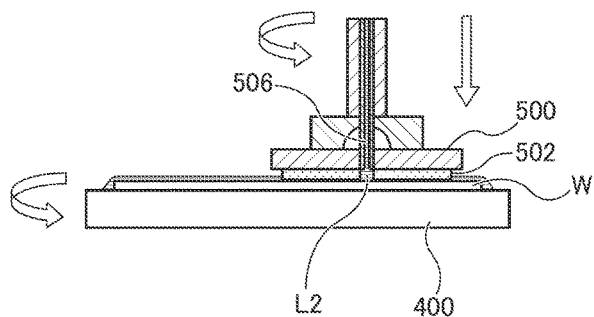
FIG. 8B is a schematic diagram showing the third example of the procedure of preload of process liquid in buffing.

FIGS. 8A and 8B are schematic diagrams showing a third example of the procedure of the preload of the process liquid in the buffing. This example is an example in which the external nozzles 710, 720, and 730 are not provided or the external nozzles 710, 720, and 730 are not used. In this example, first, as shown in FIG. 8A, while the buff head 500 is present in the rising position and while the buff head 500 moves from the rising position to the contact position, the process liquid L2 is supplied onto the wafer W through the internal supply line 506 in a state in which the buff table 400 rotates. Since the process liquid L2 is supplied in the state in which the buff table 400 rotates, the process liquid L2 can uniformly spread on the wafer W. In this example, in order to improve a throughput, the buff head 500 is moved to the contact position while rotating. However, as explained above, the buff head 500 may start the rotation after reaching the contact position. When the process liquid L2 sufficiently spreads over the wafer W, as shown in FIG. 8B, the buff head 500 moves to the contact position and start the buffing.

Figure 9A:
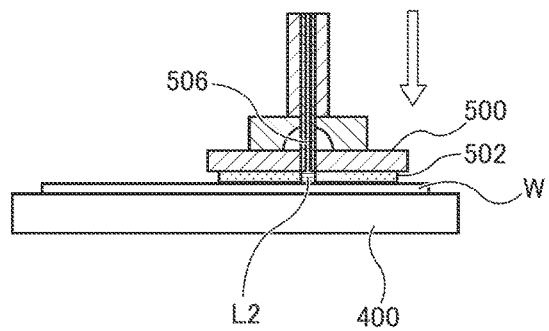
FIG. 9A is a schematic diagram showing a fourth example of a procedure of preload of process liquid in buffing.
Figure 9B:
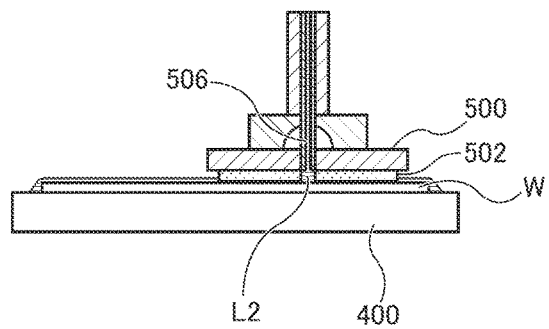
FIG. 9B is a schematic diagram showing the fourth example of the procedure of preload of process liquid in buffing.
Figure 9C:
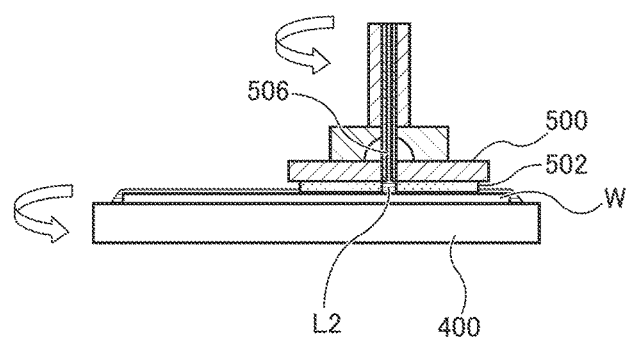
FIG. 9C is a schematic diagram showing the fourth example of the procedure of preload of process liquid in buffing.

FIG. 9A to FIG. 9C are schematic diagrams showing a fourth example of the preload of the process liquid in the buffing. This example is an example in which the external nozzles 710, 720, and 730 are not provided or the external nozzles 710, 720, and 730 are not used. In this example, first, as shown in FIG. 9A, the buff head 500 is moved from the rising position to the contact position in a state in which the rotation of the buff table 400 and the buff head 500 is stopped. Subsequently, as shown in FIG. 9B, the process liquid L2 is supplied onto the wafer W through the internal supply line 506. After the process liquid L2 is supplied for a predetermined time, as shown in FIG. 9C, the buffing is started by starting the rotation of the buff table 400 and the buff head 500. The predetermined time is set such that a sufficient amount of the process liquid L2 spreads between the buff pad 502 and the wafer W.

B. MODIFICATIONS

B-1. Modification 1

The control device 5 may control the operation of the buff head 500 such that, in the initial period of the buffing, a load smaller than a load in the following period acts on the wafer W from the buff pad 502. The load can be adjusted by adjusting a contact pressure of the buff pad 502 and the wafer W. With such a configuration, in the initial period when the process liquid less easily uniformly spreads over the wafer W, it is possible to further suppress damage to the wafer W by performing the buffing with a relatively small load.

B-2: Modification 2

The control device 5 may control, according to a swinging position of the buff arm 600, the buffing module 300A to turn on/off the supply of the process liquid L1 from the external nozzles 710, 720, and 730. Alternatively, a plurality of external nozzles for supplying the same kind of process liquid may be provided. In this case, the ON/OFF of the supply of the process liquid L1 from the nozzles may be controlled according to the swinging position of the buff arm 600. Instead of or in addition to the ON/OFF control, flow rate adjustment or pressure adjustment for the process liquid L1 supplied from the nozzles may be performed. Instead of the plurality of nozzles, a nozzle including a plurality of supply ports in different positions may be provided.

Alternatively, the external nozzles 710, 720, and 730 may include a mechanism capable of changing a supply position of the process liquid L1 according to the swinging position of the buff arm 600. Such a mechanism includes, for example, a mechanism for changing an orientation in the horizontal direction of a supply port of a nozzle with a rotating mechanism such as a rotary actuator, a mechanism for lifting and lowering the supply port of the nozzle with a cylinder or the like, a mechanism for changing an orientation in the vertical direction of the supply port of the nozzle with an oscillating mechanism or the like, and a mechanism for adjusting a flying distance of the process liquid L1 from the supply port of the nozzle by adjusting at least one of pressure and a flow rate. Naturally, it is also possible to combine these mechanisms and the ON/OFF control.

With these configurations, when the process liquid L1 is supplied from the external nozzles during the buffing, it is possible to suppress the process liquid L1 from hitting the buff arm 600 or the buff head 500 to scatter to positions other than a target. As a result, it is possible to suppress a situation in which, according to the scattering of the process liquid L1, the process liquid L1 supplied between the buff pad 502 and the wafer W decreases and the wafer W is damaged. Further, it is possible to suppress a situation in which the process liquid scatters and adheres to the buff arm 600 or the buff head 500 and an adhering object drops onto the wafer W during the buffing and damages the wafer W. In these configurations, when the buff arm 600 is not located in the center of the wafer, the process liquid L1 may be supplied toward the center of the wafer. With such a configuration, the process liquid L1 can uniformly spread over the entire wafer W with a centrifugal force by the rotation of the buff table 400.

B-3. Modification 3

The buffing modules 300A and 300B are not limited to be included in the cleaning unit 4 and may be included in the polishing unit 3.

B-4. Modification 4

After the buffing, the pure-water external nozzle 710 and the chemical external nozzle 720 can also be used for, after the buffing, cleaning of the treated wafer W or the buff table 400 after the wafer W is taken out.

B-5. Modification 5

Figure 10A:
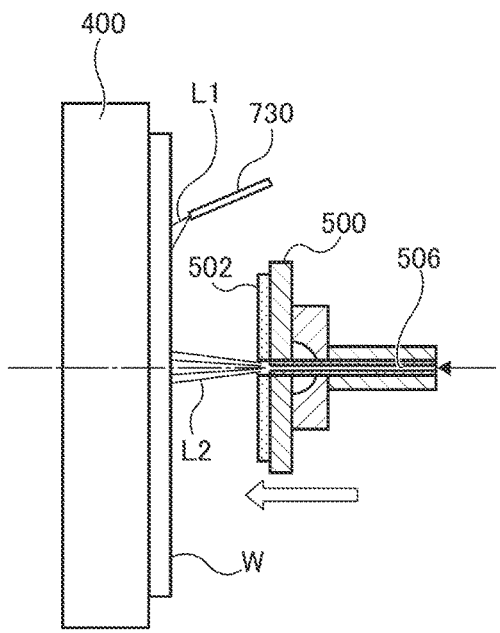
FIG. 10A is a schematic diagram showing a modification of a buffing module.

In the example explained above, the buff table 400 is not limited to hold the wafer W such that the process surface of the wafer W faces the horizontal direction and may hold the wafer W such that the process surface of the wafer W faces the vertical direction. That is, the buff table 400 may be disposed such that a holding surface of the buff table 400 for the wafer W faces the vertical direction. In this case, as shown in FIG. 10A, the buff head 500 is disposed such that the buff pad 502 faces the vertical direction. The buff head 500 is configured to be movable in a direction approaching the buff table 400 and a direction away from the buff table 400. Specifically, the buff head 500 is configured to be movable in the horizontal direction between a contact position for bringing the buff pad 502 into contact with the wafer W and a retracted position where the buff pad 502 is retracted in a direction opposite to the buff table 400 such that the buff pad 502 does not come into contact with the wafer W.

The slurry external nozzle 730 is disposed to supply the slurry to a region of the wafer W higher in the vertical direction than the buff head 500. In an example shown in FIG. 10A, the slurry external nozzle 730 is disposed in the vicinity of the buff head 500 above in the vertical direction of the buff head 500. In FIG. 10A, although illustration is omitted, the pure-water external nozzle 710 and the chemical external nozzle 720 can be disposed as the slurry external nozzle 730.

With such a configuration, the process liquid L1 supplied from the external nozzles 710, 720, and 730 spreads downward on the wafer W with the gravity. Therefore, the process liquid is efficiently supplied to between the wafer W and the buff pad 502. Note that, in FIG. 10A, a state is shown in which the process liquid L1 is preloaded by the slurry external nozzle 730 when the buff head 500 is present in the center position of the wafer W. However, the preload can be performed when the buff head 500 is present in any position on the wafer W.

Figure 10B:
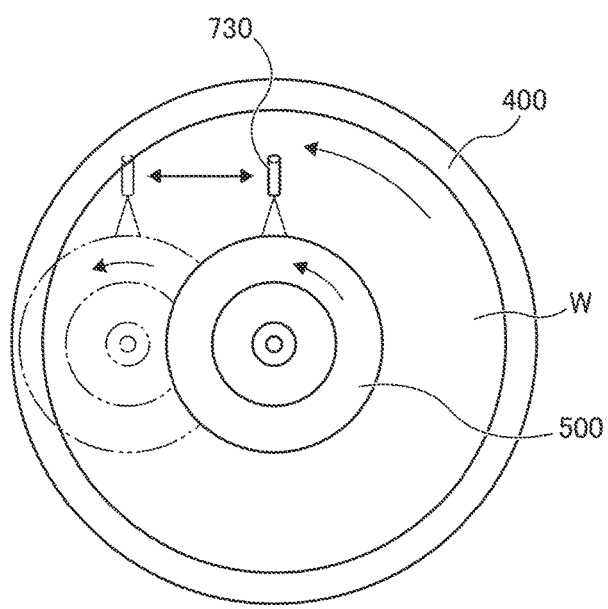
FIG. 10B is a schematic diagram showing the modification of a buffing module.

FIG. 10B shows a modification of the configuration shown in FIG. 10A. As shown in the figure, the slurry external nozzle 730 is configured to move in synchronization with relative movement of the buff table 400 and the buff head 500 in the buffing (relative movement along the process surface of the wafer W; in an example shown in the figure, the buff head 500 moves). With such a configuration, the slurry external nozzle 730 can always be located above in the vertical direction of the buff head 500. As a result, not only in the preload but also during the buffing, the process liquid is efficiently supplied to between the wafer W and the buff pad 502. The slurry external nozzle 730 may be configured to be supported by the buff arm 600 together with the buff head 500 and to move integrally with the buff head 500. Alternatively, the slurry external nozzle 730 may be configured to be independent from the buff head 500 and supported by other supporting and moving mechanisms to move. In FIG. 10B, although illustration is omitted, the pure-water external nozzle 710 and the chemical external nozzle 720 may be configured as the slurry external nozzle 730.

The embodiment of the present disclosure is explained above on the basis of the several examples. However, the embodiment of the disclosure is to facilitate understanding of the present disclosure and does not limit the present disclosure. It goes without saying that the present disclosure can be changed and improved without departing from the spirit of the present disclosure and equivalents of the present disclosure are included in the present disclosure. Any combination or omission of the components described in claims and the specification are possible in a range in which at least a part of the problems can be solved or a range in which at least a part of effects is attained.

A burring apparatus and a substrate processing apparatus according to an embodiment of the present disclosure are explained below with reference to FIG. 11 to FIG. 19.

A. EXAMPLES

Figure 11:
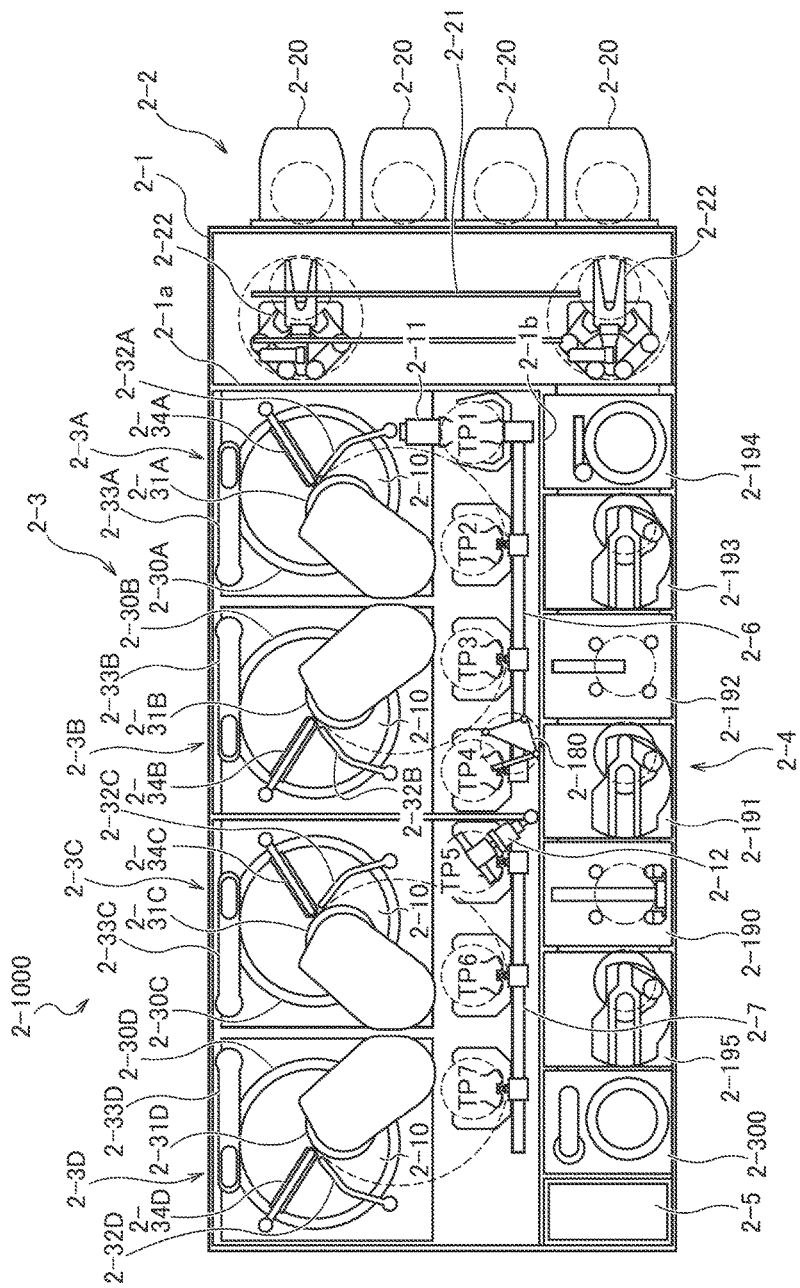
FIG. 11 is a schematic plan view showing the entire configuration of a substrate processing apparatus according to an example of the present disclosure.

FIG. 11 is a plan view showing the overall configuration of a substrate processing apparatus according to an embodiment of the present disclosure. As shown in FIG. 11, a substrate processing apparatus 2-1000 includes a substantially rectangular housing 2-1. The inside of the housing 2-1 is divided into a load/unload unit 2-2, a polishing unit 2-3, and a cleaning unit 2-4 by partition walls 2-1a and 2-1b. The load/unload unit 2-2, the polishing unit 2-3, and the cleaning unit 2-4 are assembled independently from one another and exhausted independently from one another. The cleaning unit 2-4 includes a power supply section (not shown) that supplies electric power to the substrate processing apparatus and a control device 2-5 that controls a substrate process operation.

The load/unload unit 2-2 includes two or more (in this embodiment, four) front load sections 2-20 on which wafer cassettes for stocking a large number of wafers (substrates) are placed. The front load sections 2-20 are disposed adjacent to the housing 2-1 and arrayed along the width direction (a direction perpendicular to the longitudinal direction) of the substrate processing apparatus. The front load sections 2-20 are configured such that an open cassette, an SMIF (Standard Manufacturing Interface) pod, or an FOUP (Front Opening Unified Pod) can be mounted on the front load sections 2-20.

In the load/unload unit 2-2, a traveling mechanism 2-21 is disposed along the arrangement of the front load sections 2-20. On the traveling mechanism 2-21, two conveying robots 2-22 capable of moving along an arraying direction of the wafer cassettes are set. The conveying robots 2-22 are configured to be capable of accessing the wafer cassettes mounted on the front load sections 2-20 by moving on the traveling mechanism 2-21. Each conveying robot 2-22 takes out the wafer before process from the wafer cassette and returns the treated wafer to the wafer cassette.

The polishing unit 2-3 is a region where polishing (flattening) of the wafers is performed. The polishing unit 2-3 includes a first polishing unit 2-3A, a second polishing unit 2-3B, a third polishing unit 2-3C, and a fourth polishing unit 2-3D. The polishing units 2-3A to 2-3D are arrayed along the longitudinal direction of the substrate processing apparatus as shown in FIG. 11.

As shown in FIG. 11, the first polishing unit 2-3A includes a polishing table 2-30A to which a polishing pad 2-10 including a polishing surface is attached, a top ring 2-31A for polishing a wafer while holding the wafer and pressing the wafer against the polishing pad 2-10 on the polishing table 2-30A, a polishing-liquid supply nozzle 2-32A for supplying polishing liquid and dressing liquid (e.g., pure water) to the polishing pad 2-10, a dresser 2-33A for performing dressing of the polishing surface of the polishing pad 2-10, and an atomizer 2-34A that changes mixed fluid of liquid (e.g., pure water) and gas (e.g., nitrogen gas) or the liquid (e.g., pure water) to a mist state and jets the mixed fluid or the liquid onto the polishing surface.

Similarly, the second polishing unit 2-3B includes a polishing table 2-30B, a top ring 2-31B, a polishing-liquid supply nozzle 2-32B, a dresser 2-33B, and an atomizer 2-34B. The third polishing unit 2-3C includes a polishing table 2-30C, a top ring 2-31C, a polishing-liquid supply nozzle 2-32C, a dresser 2-33C, and an atomizer 2-34C. The fourth polishing unit 2-3D includes a polishing table 2-30D, a top ring 2-31D, a polishing-liquid supply nozzle 2-32D, a dresser 2-33D, and an atomizer 2-34D.

The first polishing unit 2-3A, the second polishing unit 2-3B, the third polishing unit 2-3C, and the fourth polishing unit 2-3D have the same configuration together. Therefore, only the first polishing unit 2-3A is explained below.

Figure 12:
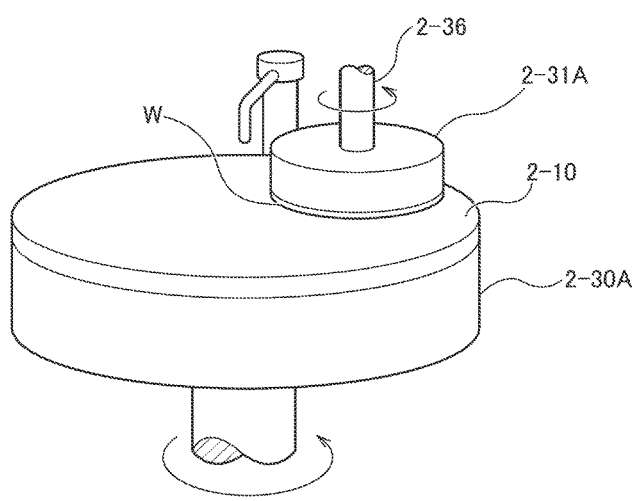
FIG. 12 is a perspective view schematically showing a polishing unit.

FIG. 12 is a perspective view schematically showing the first polishing unit 2-3A. The top ring 2-31A is supported by a top ring shaft 2-36. The polishing pad 2-10 is stuck to the upper surface of the polishing table 2-30A. The upper surface of the polishing pad 2-10 forms a polishing surface for polishing a wafer W. Note that fixed abrasive grains can also be used instead of the polishing pad 2-10. The top ring 2-31A and the polishing table 2-30A are configured to rotate around the axes thereof as indicated by arrows. The wafer W is held on the lower surface of the top ring 2-31A by vacuum attraction. During polishing, the polishing liquid is supplied from the polishing-liquid supply nozzle 2-32A to the polishing surface of the polishing pad 2-10. The wafer W, which is a polishing target, is pressed against the polishing surface by the top ring 2-31A and polished.

Next, a conveying mechanism for conveying a wafer is explained. As shown in FIG. 11, a first linear transporter 2-6 is disposed adjacent to the first polishing unit 2-3A and the second polishing unit 2-3B. The first linear transporter 2-6 is a mechanism for conveying a wafer among four conveying positions (a first conveying position TP1, a second conveying position TP2, a third conveying position TP3, and a fourth conveying position TP4 in order from the load/unload unit side) along a direction in which the polishing units 2-3A and 2-3B are arrayed.

A second linear transporter 2-7 is disposed adjacent to the third polishing unit 2-3C and the fourth polishing unit 2-3D. The second linear transporter 2-7 is a mechanism for conveying a wafer among three conveying positions (a fifth conveying position TP5, a sixth conveying position TP6, and a seventh conveying position TP7 in order from the load/unload unit side) along a direction in which the polishing units 2-3C and 2-3D are arrayed.

The wafer is conveyed to the polishing units 2-3A and 2-3B by the first linear transporter 2-6. The top ring 2-31A of the first polishing unit 2-3A moves between a polishing position and the second conveying position TP2 according to a swing action of the top ring head. Therefore, transfer of the wafer to the top ring 2-31A is performed in the second conveying position TP2. Similarly, the top ring 2-31B of the second polishing unit 2-3B moves between the polishing position and the third conveying position TP3. Transfer of the wafer to the top ring 2-31B is performed in the third conveying position TP3. The top ring 2-31C of the third polishing unit 2-3C moves between the polishing position and the sixth conveying position TP6. Transfer of the wafer to the top ring 2-31C is performed in the sixth conveying position TP6. The top ring 2-31D of the fourth polishing unit 2-3D moves between the polishing position and the seventh conveying position TP7. Transfer of the wafer to the top ring 2-31D is performed in the seventh conveying position TP7.

In the first conveying position TP1, a lifter 2-11 for receiving the wafer from the conveying robots 2-22 is disposed. The wafer is passed from the conveying robots 2-22 to the first linear transporter 2-6 via the lifter 2-11. A swing transporter 2-12 is disposed among the first linear transporter 2-6, the second linear transporter 2-7, and the cleaning unit 2-4. The swing transporter 2-12 includes a hand capable of moving between the fourth conveying position TP4 and the fifth conveying position TP5. Transfer of the wafer from the first linear transporter 2-6 to the second linear transporter 7 is performed by the swing transporter 2-12. The wafer is conveyed to the third polishing unit 2-3C and/or the fourth polishing unit 2-3D by the second linear transporter 2-7. The wafer polished by the polishing unit 2-3 is conveyed to a temporary placing table 2-180 by the swing transporter 2-12. The wafer placed on the temporary placing table 2-180 is conveyed to the cleaning unit 2-4.

Figure 13A:
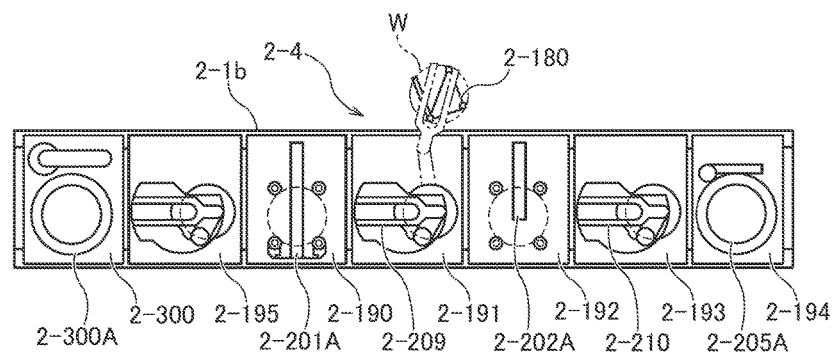
FIG. 13A is a schematic plan view of a cleaning unit.
Figure 13B:
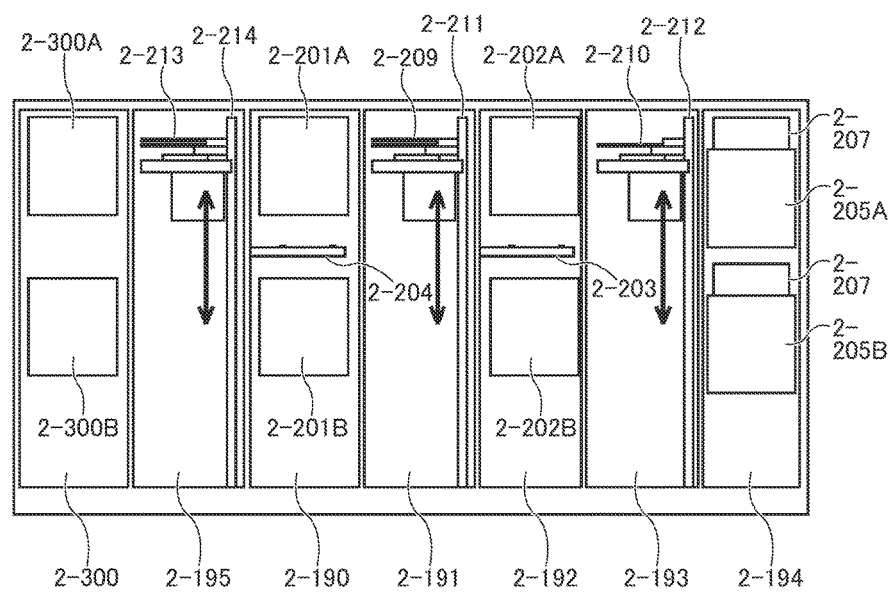
FIG. 13B is a schematic side view of the cleaning unit.

FIG. 13A is a plan view showing the cleaning unit 2-4. FIG. 13B is a side view showing the cleaning unit 2-4. As shown in FIG. 13A and FIG. 13B, the cleaning unit 2-4 is divided into a roll cleaning chamber 2-190, a first conveying chamber 2-191, a pen cleaning chamber 2-192, a second conveying chamber 2-193, a drying chamber 2-194, a buffing chamber 2-300, and a third conveying chamber 2-195.

In the roll cleaning chamber 2-190, an upper roll cleaning module 2-201A and a lower roll cleaning module 2-201B arrayed along the longitudinal direction are disposed. The upper roll cleaning module 2-201A is disposed above the lower roll cleaning module 2-201B. The upper roll cleaning module 2-201A and the lower roll cleaning module 2-201B are cleaning machines that clean a wafer by pressing two rotating roll sponges respectively against the front and rear surfaces of the wafer while supplying cleaning liquid to the front and rear surfaces of the wafer. A temporary placing table 2-204 for the wafer is provided between the upper roll cleaning module 2-201A and the lower roll cleaning module 2-201B.

In the pen cleaning chamber 2-192, an upper pen cleaning module 2-202A and a lower pen cleaning module 2-202B arrayed along the longitudinal direction are disposed. The upper pen cleaning module 2-202A is disposed above the lower pen cleaning module 2-202B. The upper pen cleaning module 2-202A and the lower pen cleaning module 2-202B are cleaning machines that clean a wafer by pressing a rotating pensile sponge against the surface of the wafer and swinging in the radial direction of the wafer while supplying the cleaning liquid to the surface of the wafer. A temporary placing table 2-203 for the wafer is provided between the upper pen cleaning module 2-202A and the lower pen cleaning module 2-202B.

In the drying chamber 2-194, an upper drying module 2-205A and a lower drying module 2-205B arrayed along the longitudinal direction are disposed. The upper drying module 2-205A and the lower drying module 2-205B are separated from each other. In upper parts of the upper drying module 2-205A and the lower drying module 2-205B, fan filter units 2-207, 2-207 that respectively supply clean air into the drying modules 2-205A and 2-205B are provided.

In the first conveying chamber 2-191, a first conveying robot (conveying mechanism) 2-209 movable up and down is disposed. In the second conveying chamber 2-193, a second conveying robot 2-210 movable up and down is disposed. In the third conveying chamber 2-195, a third conveying robot (conveying mechanism) 2-213 movable up and down is disposed. The first conveying robot 2-209, the second conveying robot 2-210, and the third conveying robot 2-213 are respectively movably supported by supporting shafts 2-211, 2-212, and 2-214 extending in the longitudinal direction. The first conveying robot 2-209, the second conveying robot 2-210, and the third conveying robot 2-213 include driving mechanisms such as motors inside and are configured to be movable up and down along the supporting shafts 2-211, 2-212, and 2-214. The first conveying robot 2-209 includes hands in two upper and lower stages. As indicated by a dotted line in FIG. 13A, the first conveying robot 2-209 is disposed in a position where the hand on the lower side of the first conveying robot 2-209 is accessible to the temporary placing table 2-180.

The first conveying robot 2-209 operates to convey the wafer W among the temporary placing table 2-180, the upper roll cleaning module 2-201A, the lower roll cleaning module 2-201B, the temporary placing table 2-204, the temporary placing table 2-203, the upper pen cleaning module 2-202A, and the lower pen cleaning module 2-202B. When conveying a wafer before cleaning (a wafer to which slurry adheres), the first conveying robot 2-209 uses the hand on the lower side. When conveying the wafer after cleaning, the first conveying robot 2-209 uses the hand on the upper side.

The second conveying robot 2-210 operates to convey the wafer W among the upper pen cleaning module 2-202A, the lower pen cleaning module 2-202B, the temporary placing table 2-203, the upper drying module 2-205A, and the lower drying module 2-205B. Since the second conveying robot 2-210 conveys only the cleaned wafer, the second conveying robot 2-210 includes only one hand. The conveying robots 2-22 shown in FIG. 11 take out a wafer from the upper drying module 2-205A or the lower drying module 2-205B and return the wafer to the wafer cassette using the hand on the upper side.

In the buffing chamber 2-300, an upper buffing module 2-300A and a lower buffing module 2-300B are provided. The third conveying robot 2-213 operates to convey the wafer W among the upper roll cleaning module 2-201A, the lower roll cleaning module 2-201B, the temporary placing table 2-204, the upper buffing module 2-300A, and the lower buffing module 2-300B.

In this embodiment, an example is explained in which, in the cleaning unit 2-4, the buffing chamber 2-300, the roll cleaning chamber 2-190, and the pen cleaning chamber 2-192 are disposed to be arranged in order from a far side of the load/unload unit 2-2. However, not limited to this, but a disposition form of the buffing chamber 2-300, the roll cleaning chamber 2-190, and the pen cleaning chamber 2-192 can be selected as appropriate according to the quality of wafers, the throughput, and the like. The upper buffing module 2-300A and the lower buffing module 2-300B have the same configuration. Therefore, in the following explanation, only the upper buffing module 2-300A is explained.

Figure 14:
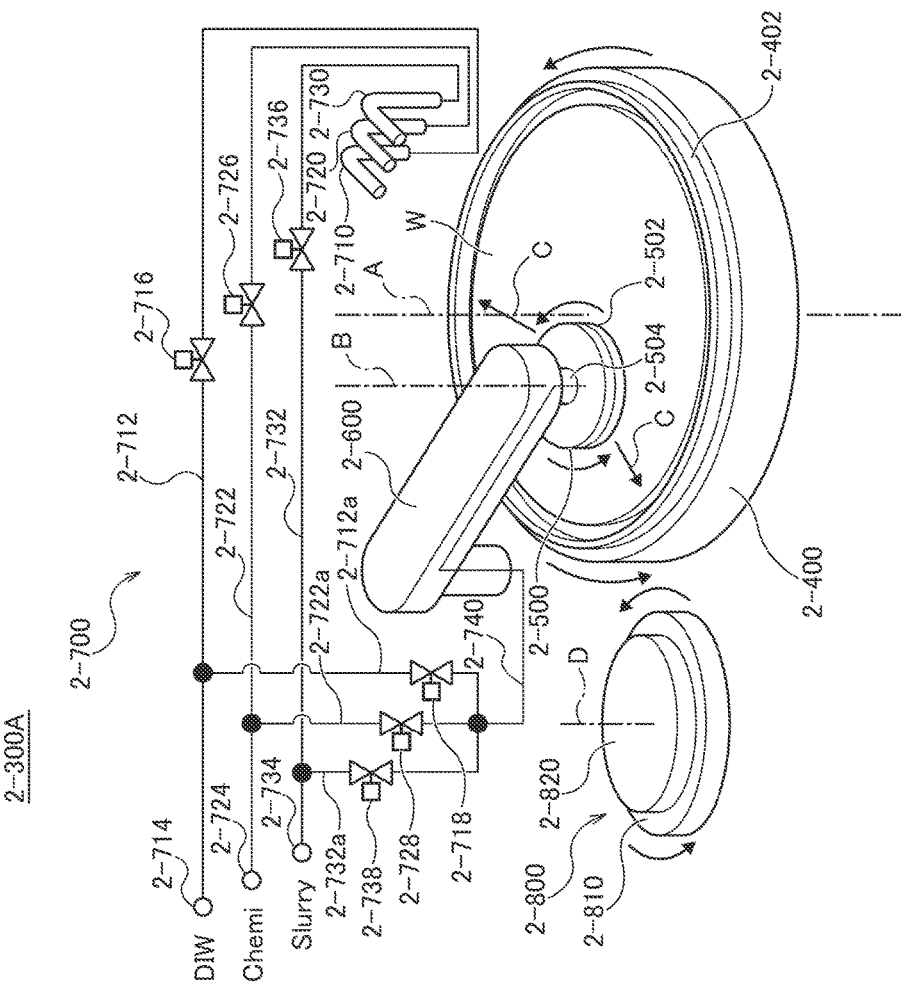
FIG. 14 is a diagram showing the schematic configuration of a buffing module.

FIG. 14 is a diagram showing the schematic configuration of the upper buffing module. As shown in FIG. 14, the buffing module 2-300A includes a buff table 2-400 for holding the wafer W functioning as a type of the substrate, a buff head 2-500 to which a buff pad 2-502 for buffing a process surface of the wafer W is attached, a buff arm 2-600 for holding the buff head 2-500, a liquid supply system 2-700 for supplying various kinds of process liquid, and a conditioning section 2-800 for performing conditioning of the buff pad 2-502.

The buff table 2-400 includes a mechanism for holding the wafer W. In this example, the wafer holding mechanism is a vacuum attraction system. However, the wafer holding mechanism can be any system. For example, the wafer holding mechanism may be a clamp system for clamping the front surface and the rear surface of the wafer W in at least one place in the peripheral edge portion of the wafer W or may be a roller chuck system for holding the side surface of the wafer W in at least one place of the peripheral edge portion of the wafer W. In this example, the buff table 2-400 holds the wafer W such that the process surface of the wafer W faces upward.

In the outer circumferential portion of the buff table 2-400, a wall section 2-402 extending upward in the vertical direction from the buff table 2-400 is provided over the entire circumferential direction. The wall section 2-402 has a ring shape and is closed in the horizontal direction. The height of the wall section 2-402 is set higher than the upper surface of the wafer W held on the buff table 2-400. For example, the height of the wall section 2-402 with respect to the upper surface of the wafer W can be set to several centimeters. Details of the wall section 2-402 are explained below.

The buff table 2-400 is configured to rotate around a rotation axis A with a not-shown driving mechanism. The buff head 2-500 is attached to the buff arm 2-600 via a shaft 2-504 configured to be rotatable. The buff pad 2-502 for buffing the wafer W is attached to a surface of the buff head 2-500 opposed to the wafer W (or the buff table 2-400). The buff arm 2-600 is configured to rotate the buff head 2-500 around a rotation axis B. The area of the buff pad 2-502 is smaller than the area of the wafer W (or the buff table 2-400). Therefore, the buff arm 2-600 is configured to be capable of swinging the buff head 2-500 in the radial direction of the wafer W as indicated by an arrow C such that the wafer W can be uniformly buffed. The buff arm 2-600 is configured to be capable of swinging the buff head 2-500 to a position where the buff pad 2-502 is opposed to the conditioning section 2-800. The buff head 2-500 is configured to be movable in a direction approaching the buff table 2-400 and a direction away from the buff table 2-400 (in this example, up and down) with an actuator (not shown). Consequently, it is possible to press the buff pad 2-502 against the wafer W with a predetermined pressure. Such a configuration may be realized by a telescopic motion of the shaft 2-504 or may be realized by an upward and downward motion of the buff arm 2-600.

The liquid supply system 2-700 includes a pure-water external nozzle 2-710 for supplying pure water (in the figure, represented as DIW) to the process surface of the wafer W. The pure-water external nozzle 2-710 is connected to a pure-water supply source 2-714 via a pure water pipe 2-712. In the pure water pipe 2-712, an opening and closing valve 2-716 capable of opening and closing the pure water pipe 2-712 is provided. The control device 2-5 can supply the pure water to the process surface of the wafer W at any timing by controlling opening and closing of the opening and closing valve 2-716.

The liquid supply system 2-700 includes a chemical external nozzle 2-720 for supplying a chemical (in the figure, represented as Chemi) to the process surface of the wafer W. The chemical external nozzle 2-720 is connected to a chemical supply source 2-724 via a chemical pipe 2-722. In the chemical pipe 2-722, an opening and closing valve 2-726 capable of opening and closing the chemical pipe 2-722 is provided. The control device 2-5 can supply the chemical to the process surface of the wafer W at any timing by controlling opening and closing of the opening and closing valve 2-726.

The liquid supply system 2-700 includes a slurry external nozzle 2-730 for supplying slurry (in the figure, represented as Slurry) to the process surface of the wafer W. The slurry external nozzle 2-730 is connected to a slurry supply source 2-734 via a slurry pipe 2-732. In the slurry pipe 2-732, an opening and closing valve 2-736 capable of opening and closing the slurry pipe 2-732 is provided. The control device 2-5 can supply the slurry to the process surface of the wafer W at any timing by controlling opening and closing of the opening and closing valve 2-736.

In this example, the positions of all of the external nozzles 2-710, 2-720, and 2-730 are fixed. The external nozzles 2-710, 2-720, and 2-730 supply pure water, a chemical, or slurry toward a fixed position set in advance. These kinds of process liquid are supplied to a position in which the process liquid is efficiently supplied to the buff pad 2-502 by the rotation of the wafer W. The external nozzles 2-710, 2-720, and 2-730 may be configured as one or two nozzles common to two or more of the kinds of process liquids. The external nozzles may be configured to supply at least one kind of process liquid among the pure water, the chemical, and the slurry.

The buffing module 2-300A is further configured to be capable of selectively supplying the process liquid (the pure water, the chemical, or the slurry) to the process surface of the wafer W via the buff arm 2-600, the buff head 2-500, and the buff pad 2-502. That is, a branching pure water pipe 2-712a branches from between the pure-water supply source 2-714 and the opening and closing valve 2-716 in the pure water pipe 2-712. Similarly, a branching chemical pipe 2-722a branches from between a chemical supply source 2-724 and an opening and closing valve 2-726 in a chemical pipe 2-722. A branching slurry pipe 2-732a branches from between a slurry supply source 2-734 and an opening and closing valve 2-736 in a slurry pipe 2-732. The branching pure water pipe 2-712a, the branching chemical pipe 2-722a, and the branching slurry pipe 2-732a merge into the liquid supply pipe 2-740. In the branching pure water pipe 2-712a, an opening and closing valve 2-718 capable of opening and closing the branching pure water pipe 2-712a is provided. In the branching chemical pipe 2-722a, an opening and closing valve 2-728 capable of opening and closing the branching chemical pipe 2-722a is provided. In the branching slurry pipe 2-732a, an opening and closing valve 2-738 capable of opening and closing the branching slurry pipe 2-732a is provided.

Figure 15:
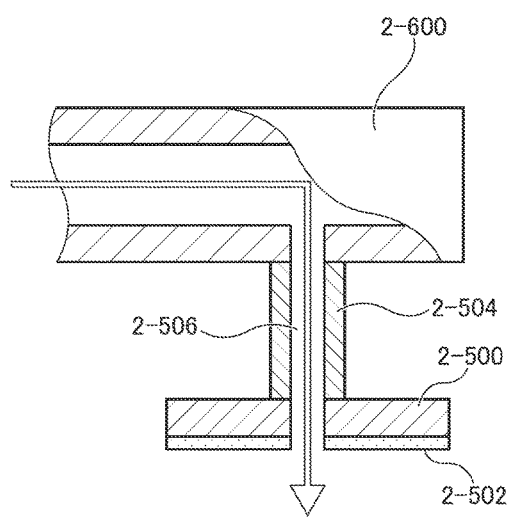
FIG. 15 is a schematic diagram showing the internal configuration of a buff head.

The liquid supply pipe 2-740 communicates with the inside of the buff arm 2-600, the center inside of the buff head 2-500, and the center inside of the buff pad 2-502. Specifically, as shown in FIG. 15, an internal supply line 2-506 is formed inside the buff arm 2-600, the buff head 2-500, and the buff pad 2-502. The internal supply line 2-506 communicates with the liquid supply pipe 2-740. The internal supply line 2-506 opens toward the upper surface of the buff table 2-400 (the process surface of the wafer W). In this example, only one opening of the internal supply line 2-506 is provided in the center of the buff pad 2-502. However, a plurality of openings may be provided. For example, the internal supply line 2-506 may branch toward a plurality of distributed openings through a water pool jacket structure formed in the buff head 2-500. The plurality of openings may be distributed such that the positions in the radial directions thereof are different. The control device 2-5 can supply any one of pure water, a chemical, and slurry or mixed liquid of any combination thereof to the process surface of the wafer W at any timing by controlling the opening and closing of the opening and closing valve 2-718, the opening and closing valve 2-728, and the opening and closing valve 2-736. As it is evident from the above explanation, the buffing module 2-300A includes the process liquid supplying means of the two systems, i.e., the external nozzles 2-710, 2-720, and 2-730 and the internal supply line 2-506. One or both of these two systems can be selectively used.

The buffing module 2-300A can buff the wafer W by supplying the process liquid to the wafer W via at least one of the external nozzles 2-710, 2-720, and 2-730 and the internal supply line 2-506 and rotating the buff table 2-400 around the rotation axis A, pressing the buff pad 2-502 against the process surface of the wafer W, and swinging the buff head 2-500 in the arrow C direction while rotating the buff head 2-500 around the rotation axis B. In this example, such an operation of the buffing module 2-300A is controlled by the control device 2-5. However, the buffing module 2-300A may be controlled by a control module exclusive for the buffing module 2-300A instead of the control device 2-5. Note that the relative motion of the buff table 2-400 and the buff head 2-500 in the buffing is not limited to the example explained above and may be realized by at least one of a rotational motion, a translational motion, an arcuate motion, a reciprocating motion, a scroll motion, and an angle rotational motion (a motion for rotating by a predetermined angle smaller than 360 degrees).

In this application, the buffing includes at least one of buff polishing and buff cleaning. The buff polishing is process for, while bringing the buff pad 2-502 into contact with the wafer W, relatively moving the wafer W and the buff pad 2-502 and interposing slurry between the wafer W and the buff pad 2-502 to thereby polish and remove the process surface of the wafer W. The buff polishing is usually process for performing so-called finish polishing after main polishing performed for the purpose of planarizing unevenness of the surface of the wafer and removing an excess film formed on surfaces other than insides of trenches and vias. A removal processing amount of the buff polishing is, for example, approximately several nanometers to ten and a few nanometers. As the buff pad 2-502, for example, a pad obtained by stacking foaming polyurethane and nonwoven fabric (specifically, for example, IC1000 (R)/SUBA (R)-based pad) and a suede-like porous polyurethane non-fibrous pad (specifically, for example, commercially available POLITEX (R)) can be used. The buff polishing is process with which a physical acting force stronger than a physical acting force applied to the wafer W by a roll sponge made of PVA in the roll cleaning chamber 2-190 and a physical acting force applied to the wafer W by a pen sponge made of PVA in the pen cleaning chamber 2-192 can be applied to the wafer W. With the buff polishing, it is possible to realize removal of a surface layer portion having damage such as scratches or a surface layer portion to which foreign matters adhere, additional removal of a part that cannot be removed by the main polishing in the polishing unit 2-3, or improvement of morphology such as unevenness of a very small region and a film thickness distribution over the entire substrate after the main polishing can be realized.

The buff cleaning is finish process for relatively moving the wafer W and the buff pad 2-502 while bringing the buff pad 2-502 into contact with the wafer W and interposing cleaning process liquid (a chemical, pure water, or mixture of the chemical and the pure water) between the wafer W and the buff pad 2-502 to thereby remove foreign matters on the surface of the wafer W and reforming the process surface. As the buff pad 2-502, the IC1000 (R)/SUBA (R)-based pad, POLITEX (R), or the like is used. The buff cleaning is processing with which a physical acting force stronger than a physical acting force applied to the wafer W by a roll sponge mad of PVA in the roll cleaning chamber 2-190 and a physical acting force applied to the wafer W by a pen sponge made of PVA in the pen cleaning chamber 2-192 can be applied to the wafer W. With the buff cleaning, it is possible to efficiently clean and remove, for example, foreign matters having large adhesiveness that cannot be removed by simply bringing a sponge material made of PVA into contact with the wafer W. For the buff cleaning in the present disclosure, it is also possible to use a PVA sponge as the buff pad.

The conditioning section 2-800 is a member for conditioning (dressing) the surface of the buff pad 2-502. In this example, the conditioning section 2-800 is disposed outside the buff table 2-400. As an alternative form, the conditioning section 2-800 may move to above the buff table 2-400 and below the buff head 2-500 and perform conditioning of the buff pad 2-502. In this case, the conditioning is desirably performed after the treated wafer W is taken out. The conditioning section 2-800 includes a dress table 2-810 and a dresser 2-820 set on the dress table 2-810. The dress table 2-810 is configured to be capable of rotating around a rotation axis D with a not-shown driving mechanism. The dresser 2-820 is formed of, for example, a diamond dresser, a brush dresser, or a combination of the diamond dresser and the brush dresser.

When performing the conditioning of the buff pad 2-502, the buffing module 2-300A turns the buff arm 2-600 to a position where the buff pad 2-502 is opposed to the dresser 2-820. The buffing module 2-300A performs the conditioning of the buff pad 2-502 by rotating the dress table 2-810 around the rotation axis D and rotating the buff head 2-500 and pressing the buff pad 2-502 against the dresser 2-820. Such a conditioning operation can be performed, for example, while the buffed wafer W is replaced with the wafer W that should be buffed next.

With the buffing module 2-300A explained above, by performing the buffing as post process of the wafer W subjected to chemical mechanical polishing, it is possible to perform finish polishing while suppressing damage to (a defect of) the wafer W or remove damage that occurs in the chemical mechanical polishing. Alternatively, compared with the conventional roll cleaning and the conventional pen cleaning, it is possible to efficiently clean and remove, for example, foreign matters having large adhesiveness. In particular, in this example, it is possible to cause the process liquid to be surely present between the buff pad 2-502 and the wafer W by the wall section 2-402 explained above. Therefore, it is possible to suppress a situation in which liquid film shortage occurs and the wafer W is damaged. Alternatively, it is possible to improve cleaning efficiency. Buffing performed using the wall section 2-402 is explained below.

Figure 16A:
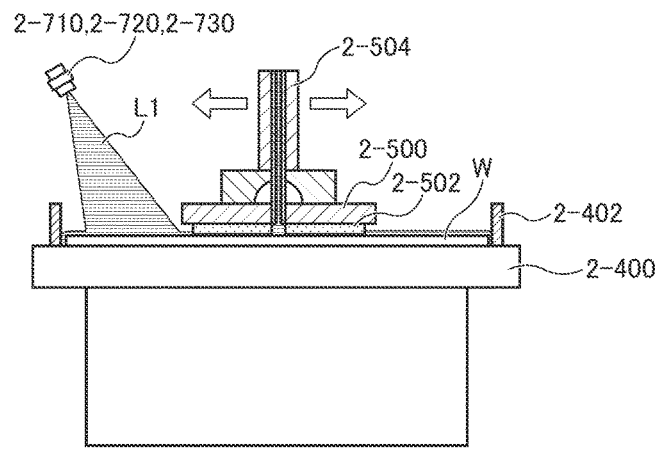
FIG. 16A is an explanatory diagram showing an overview of buffing.
Figure 16B:
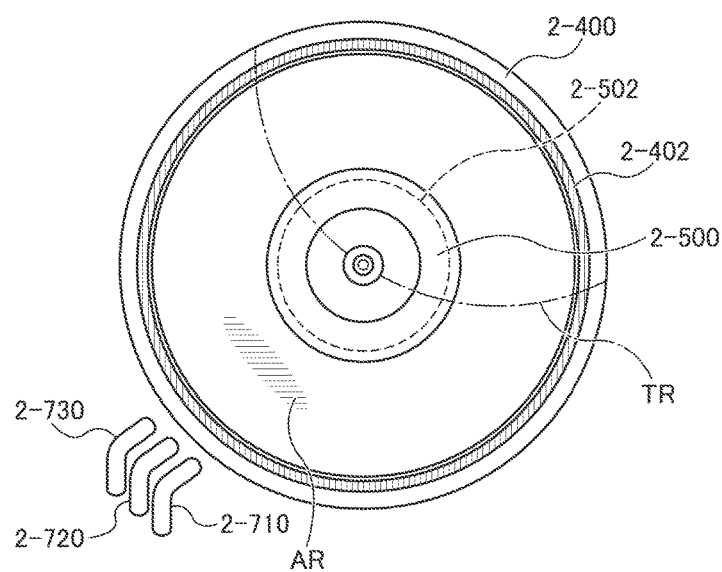
FIG. 16B is an explanatory diagram showing an overview of the buffing.

FIGS. 16A and 16B are explanatory diagrams showing an overview of the buffing. FIG. 16A is a schematic side view of the buffing module 2-300A. FIG. 16B is a top view of the buffing module 2-300A. In an example shown in the figures, the buffing module 2-300A swings the buff arm 2-600 (and thus the buff head 2-500) while supplying the process liquid L1 from at least one of the external nozzles 2-710, 2-720, and 2-730 and performs the buffing. As shown in FIG. 16A, the wall section 2-402 is provided in the outer circumferential portion of the buff table 2-400. Therefore, the process liquid L1 supplied from at least one of the external nozzles 2-710, 2-720, and 2-730 is stored in the inner side region of the wall section 2-402. Therefore, it is possible to cause the process liquid to surely present between the buff pad 2-502 and the wafer W. When the supply of the process liquid L1 continuously or intermittently is continued, the process liquid L1 exceeding the capacity of the inner side region overflows the wall section 2-402 and flows out to the outside of the wall section 2-402. Instead of or in addition to the configuration in which the process liquid L1 is supplied from the external nozzles 2-710, 2-720, and 2-730, the process liquid L1 may be supplied through the internal supply line 2-506 formed in the buff head 2-500.

With such a configuration, the buffing can be performed in a state in which the process liquid L1 is stored in the inner side region of the wall section 2-402. Therefore, irrespective of a place of the inner side region to which the process liquid L1 is supplied, for example, even if the process liquid L1 is supplied to a place far from the buff pad 2-502, liquid film shortage does not occur between the buff pad 2-502 and the wafer W. Therefore, in this example, the process liquid L1 is supplied from at least one of the external nozzles 2-710, 2-720, and 2-730 toward a region AR avoiding a swinging track of the buff pad 2-502. In FIG. 16B, a track TR of the center of the buff pad 2-502 is shown. With such a configuration, the process liquid L1 supplied from the external nozzles 2-710, 2-720, and 2-730 does not hit the buff arm 2-600 or the buff head 2-500. Therefore, it is possible to suppress a situation in which the process liquid L1 scatters and adheres to the buff arm 2-600 or the buff head 2-500 and an adhering object drops onto the wafer W during the buffing to damage the wafer W.

As shown in FIG. 17A, in this example, the entire wall section 2-402 is configured to be capable of performing a vertical motion by an actuator 2-406. Specifically, the wall section 2-402 can be housed in a recess formed in the buff table 2-400 across the entire height thereof. In FIG. 17A, the position of the wall section 2-402 completely housed in the recess is indicated by a dotted line. Consequently, the height of the wall section 2-402 can be adjusted to any height from zero to maximum height indicated by a solid line in FIG. 17. When the process liquid L1 is stored in the inner side region of the wall section 2-402, if the wall section 2-402 is moved in a direction in which the height of the wall section 2-402 decreases, the stored process liquid L1 is discharged to the outside by an amount exceeding the wall section 2-402. Naturally, when the wall section 2-402 is moved until the height of the wall section 2-402 decreases to zero, the whole amount of the stored process liquid L1 is discharged to the outside (the whole amount means substantially the whole amount; the whole amount of the process liquid L1 is regarded as being discharged even when a liquid film remains on the wafer W). That is, it is possible to adjust, with the vertical movement of the wall section 2-402, an amount of the process liquid that can be stored in the inner side region of the wall section 2-402. Therefore, in this example, the actuator 2-406 for changing the height of the wall section 2-402 is also referred to as storage-amount adjusting section 2-406.

As shown in FIG. 17A, the buffing module 2-300A includes a sensor 2-420 for detecting a liquid surface level of the process liquid L1 stored in the inner side region of the wall section 2-402. The control device 2-5 can adjust, using a detection result of the sensor 2-420, the liquid surface level of the process liquid L1 stored in the inner side region of the wall section 2-402. The adjustment of the liquid surface level can be performed by at least adjusting a supply amount of the process liquid L1 or adjusting the height of the wall section 2-402. With such a configuration, according to a situation, it is possible to store an appropriate amount of the process liquid L1 in the inner side region. A specific example of such control is explained below.

FIG. 17B to FIG. 17E show several alternative forms for adjusting an amount of the process liquid that can be stored in the inner side region of the wall section 2-402. In an example shown in FIG. 17B showing a state in which the wall section 2-402 is viewed from above, the wall section 2-402 includes a first portion 2-402a and a second portion 2-402b. Both of the first portion 2-402a and the second portion 2-402b have a substantially semicircular shape and are closed in the horizontal direction by disposing end portions thereof to overlap (i.e., configured to be capable of storing the process liquid L1 in the inner side region). The position of the first portion 2-402a is fixed. On the other hand, the second portion 2-402b is configured to move horizontally (horizontally rotate) with the storage-amount adjusting section 2-406 (not shown). The second portion 2-402b rotates as shown in the figure, whereby an opening in the horizontal direction is formed between the first portion 2-402a and the second portion 2-402b. When the process liquid L1 is stored in the inner side region of the wall section 2-402, the process liquid L1 flows out to the outside from this opening. It is possible to adjust the liquid surface level, that is, a storage amount of the process liquid L1 by adjusting time in which the opening is formed.

In an example shown in FIG. 17C showing a state in which the wall section 2-402 is viewed from above, the wall section 2-402 includes a first portion 2-402c and a second portion 2-402d. Both of the first portion 2-402c and the second portion 2-402d have an arcuate shape and are closed in the horizontal direction by disposing end portions thereof to overlap. The second portion 2-402d has the total length shorter than the total length of the first portion 2-402c. The position of the first portion 2-402c is fixed. On the other hand, the second portion 2-402d is configured to be capable of vertically moving with the storage-amount adjusting section 2-406 (not shown). With such a configuration, an effect same as the effect in the configuration shown in FIG. 17A is attained. Moreover, since a movable portion is small compared with the configuration shown in FIG. 17A, the actuator 2-406 can be reduced in size. Further, since drainage can be led in only a specific direction, it is possible to efficiently perform collection of the drainage. That is, it is possible to lead, with a small water collection facility, the drainage to a drainage process facility (not shown). Instead of the vertical motion, the second portion 2-402d may move horizontally (horizontally rotate) as in the configuration shown in FIG. 17B. Alternatively, as shown in FIG. 17D, the second portion 2-402d may rotate around the upper end in the vertical direction thereof. The second portion 2-402d may rotate around the lower end in the vertical direction thereof. Naturally, two or more of these various motions may be combined.

In an example shown in FIG. 17E, the wall section 2-402 is fixedly provided. On the other hand, the buffing module 2-300A includes a discharge route 2-408 and a valve 2-410 instead of the actuator 2-406. The discharge route 2-408 pierces through the buff table 2-400 in the vertical direction from an opening 2-404 formed in the upper surface of the buff table 2-400 and communicates with the drainage process facility. The valve 2-410 opens and closes a circulation state of the discharge route 2-408. The valve 2-410 may be provided near the opening 2-404. In such an example, by opening the valve 2-410, it is possible to discharge the process liquid L1 stored in the inner side region of the wall section 2-402. By controlling an opening and closing state of the valve 2-410, it is also possible to adjust the liquid surface level of the process liquid L1. A polishing product or a cleaning product caused by the buffing often precipitates in the stored process liquid L1. Therefore, as shown in FIG. 17E, it is possible to efficiently discharge the products by draining the process liquid L1 from the upper surface of the buff table 2-400, that is, the lowest portion of a storage space of the process liquid L1. As a result, it is possible to suppress the wafer W from being damaged because of the products.

However, the opening may be formed in the wall section 2-402. In this case, the opening may be provided in the vicinity of the lowest portion of the wall section 2-402 or may be provided above the lowest portion. The various forms explained above may be used in combination.

Figure 18:
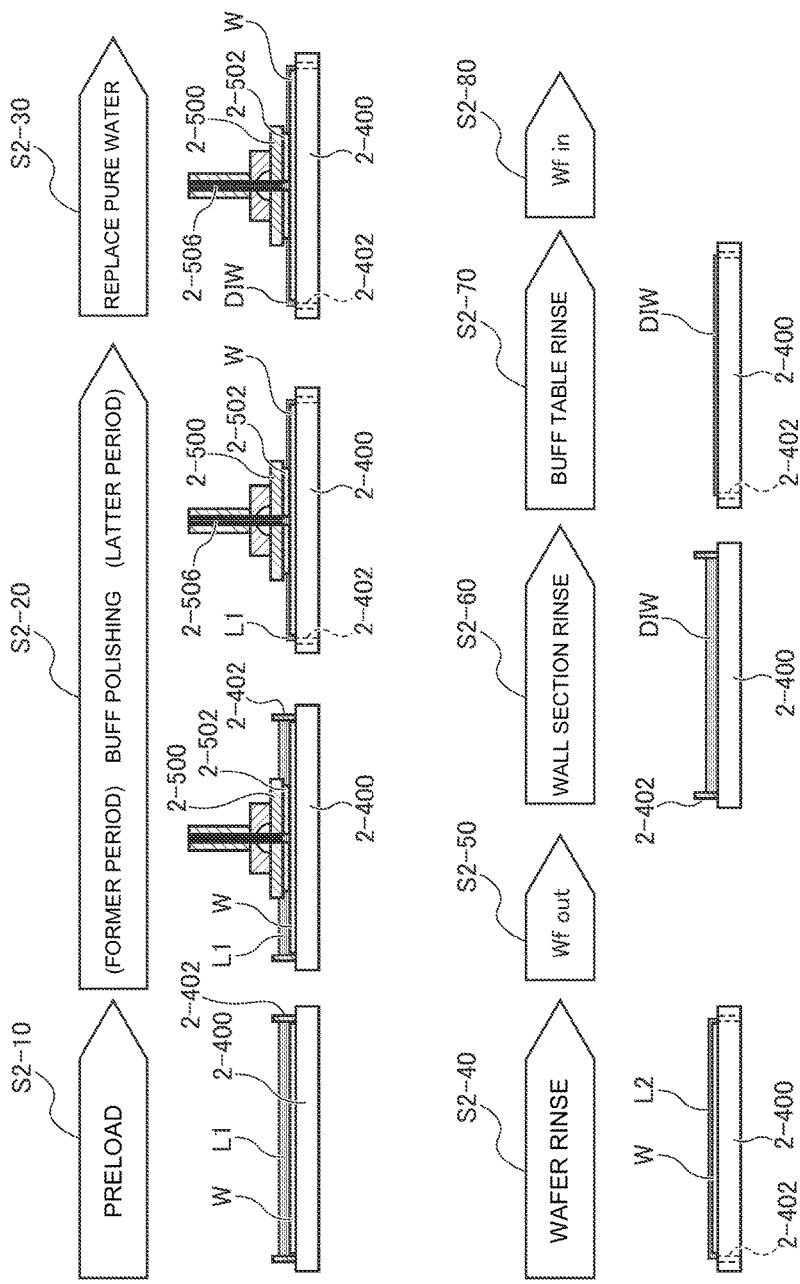
FIG. 18 is a schematic diagram showing an example of a procedure of the buffing.

FIG. 18 shows an example of a procedure of buffing in performing storage control for the process liquid using the sensor 2-420. In this example, buff polishing is carried out as a form of the buffing. As shown in the figure, when the buffing is started, first, in a state in which the wall section 2-402 extends upward from the buff table 2-400, the process liquid L1 is preloaded from at least one of the pure-water external nozzle 2-710, the chemical external nozzle 2-720, and the slurry external nozzle 2-730 (step S2-10). Here, slurry is supplied from the slurry external nozzle 2-730 as the process liquid L1. Consequently, the process liquid L1 is stored to a predetermined liquid surface level in the inner side region of the wall section 2-402. Instead of or in addition to the external nozzles 2-710, 2-720, and 2-730, the process liquid L1 may be supplied through the internal supply line 2-506. By storing the process liquid L1 in advance in this way, at the start of the buffing when the process liquid between the buff pad 2-502 and the wafer W tends to be insufficient, it is possible to spread a sufficient amount of the process liquid L1 between the buff pad 2-502 and the wafer W. As a result, it is possible to suppress the wafer W from being damaged in an initial stage of the buffing. Moreover, compared with a configuration not including the wall section 2-402 (i.e., a configuration in which the supplied process liquid L1 flows out without being dammed), it is possible to reduce time for preloading the process liquid L1 and a throughput is improved.

Subsequently, the buff head 2-500 moves from a position to which the buff pad 2-502 rises upward not to come into contact with the wafer W (hereinafter also referred to as rising position) to a position for bringing the buff pad 2-502 into contact with the wafer W (hereinafter also referred to as contact position), the buff table 2-400 and the buff head 2-500 rotate, and the buffing is started (step S2-20). As shown in the figure, in a former period of the buffing, the buffing is carried out in a state in which the process liquid L1 is stored in the inner side region of the wall section 2-402. The wall section 2-402 functions as a scattering prevention wall besides a storage wall for the process liquid L1. After the start of the buffing, the supply of the process liquid L1 from the external nozzles 2-710, 2-720, and 2-730 may be stopped or may be continuously or intermittently continued. When the supply of the process liquid L1 is stopped, it is possible to reduce an amount of use of the process liquid L1. On the other hand, when the supply of the process liquid L1 is continued, a part of the process liquid L1 may overflow the wall section 2-402. The process liquid L1 may be replaced little by little. When the configuration shown in FIG. 17E is adopted, the process liquid L1 may be sequentially replaced according to discharge of a part of the process liquid L1 via the discharge route 2-408 instead of the overflow. Consequently, the concentration of the polishing product is reduced. In the former period, the buff table 2-400 is rotated at relatively high speed.

In a latter period of the buffing, the wall section 2-402 is completely retracted in the buff table 2-400. The whole amount of stored process liquid L1 is discharged. At this point, the supply of the process liquid L1 from the external nozzles 2-710, 2-720, and 2-730 is stopped and the supply of the process liquid L1 through the internal supply line 2-506 is started. The process liquid L1 can uniformly spread between the buff pad 2-502 and the wafer W with a centrifugal force involved in the rotation of the buff head 2-500 and a supply pressure of the process liquid L1. In the latter period, the buff table 2-400 is desirably rotated at lower speed than in the former period.

In step S2-20, in the former period, the buff table 2-400 is rotated at high speed, whereby a polishing rate can be improved. Specifically, if the wall section 2-402 is not provided in the buff table 2-400, when the process liquid L1 is supplied from the external nozzles 2-710, 2-720, and 2-730, that is, when the process liquid L1 is supplied on the outside of the buff pad 2-502, it is likely that the process liquid L1 does not sufficiently spread to the center of the buff pad 2-502 during high-speed rotation of the buff table 2-400. This is caused by an increase in a centrifugal force due to the high-speed rotation. When the wafer W having a relatively large diameter (e.g., 300 mm) is buffed, in order to efficiently perform the buffing, the diameter of the buff head 2-500 is also relatively large (e.g., 100 mm). Therefore, when the process liquid L1 is supplied on the outside of the buff pad 2-502, it is likely that the process liquid L1 does not sufficiently spread to the center of the buff pad 2-502. When these phenomena occur, the polishing rate is deteriorated. However, with the configuration of this example, the buffing is performed in a state in which the process liquid L1 is stored in the inner side region of the wall section 2-402. Therefore, it is possible to facilitate the spread of a sufficient amount of the process liquid L1 to the center of the buff pad 2-502. Further, if the wall section 2-402 is not provided in the buff table 2-400, a ratio of the process liquid L1 flowing out to the outside of the wafer W without contributing to polishing to the process liquid L1 supplied onto the wafer W is not small. However, since the wall section 2-402 is provided, the supplied process liquid L1 is efficiently used. A maximum polishing rate can be obtained with a small supply amount. In addition, an amount of the process liquid L1 used for the preload before the polishing can also be reduced. It is possible to suppress a consumed amount of the process liquid L1 and improve a throughput.

On the other hand, in the latter period when the concentration of the products in the process liquid L1 is relatively high, since the buffing is performed in a state in which the process liquid L1 is discharged, it is possible to suppress the wafer W from being damaged by the products. Moreover, since the buff table 2-400 is rotated at low speed, the process liquid L1 easily spreads over the entire buff pad 2-502. This effect is further facilitated by supplying the process liquid L1 from the center of the buff pad 2-502. In this way, in this embodiment, both of the polishing rate of the buff polishing and the quality of the wafer W are attained by carrying out the buffing in different forms in the former period and the latter period. Temporal lengths of the former period and the latter period can be set as appropriate taking into account the polishing rate and the quality of the wafer W.

When the buff cleaning process ends in this way, subsequently, the pure water DIW is supplied to the wafer W via the internal supply line 2-506 and pure water replacement is performed (step S2-30). In this case, the wall section 2-402 remains completely retracted in the buff table 2-400. Consequently, since the pure water on the wafer W is quickly discharged, replacement efficiency is improved compared with when the wall section 2-402 extends upward.

Subsequently, the buff pad 2-502 rises upward, the process liquid L2 (here, a cleaning chemical) is supplied from the chemical external nozzle 2-720 to the wafer W, and the wafer W is rinsed (cleaned) (step S2-40). In this case, the wall section 2-402 remains completely retracted in the buff table 2-400. Consequently, since the pure water on the wafer W is quickly discharged, cleaning efficiency is improved compared with when the wall section 2-402 extends upward.

Subsequently, the wafer W is taken out (step S2-50). Thereafter, the wall section 2-402 completely retracted in the buff table 2-400 is moved upward and the pure water DIW is supplied onto the buff table 2-400 from the pure-water external nozzle 2-710 (step S2-60). Consequently, the pure water DIW is stored on the inside of the wall section 2-402 and the wall section 2-402 is cleaned. With such a process, it is possible to suppress the process liquid L1 and L2 adhering to the wall section 2-402 from adversely affecting the wafer W to be treated next time. Instead of or in addition to the cleaning of the wall section 2-402, a nozzle mechanism for jetting cleaning water may be provided. The cleaning liquid may be jetted toward the wall section 2-402 by the nozzle mechanism. With such a configuration, it is possible to more efficiently perform the cleaning of the wall section 2-402.

Subsequently, the wall section 2-402 is completely retracted in the buff table 2-400 again and the pure water DIW is supplied onto the buff table 2-400 from the pure-water external nozzle 2-710 (step S2-70). Consequently, the buff table 2-400 is cleaned (rinsed). Since the wall section 2-402 is retracted, the pure water DIW on the buff table 2-400 is quickly discharged and cleaning efficiency is improved. The water W that should be processed next is carried onto the buff table 2-400 (step S2-80). The processing returns to step S2-10. The storage control for the process liquid in the buffing is explained above using the example of the buff polishing. However, the storage control for the process liquid is effective in the buff cleaning as well. For example, in the former half of the buff cleaning, it is possible to store the process liquid and suppress a consumed amount of the process liquid. In the latter half, it is possible to perform buff cleaning with higher cleaning performance using fresh process liquid. Note that the same process liquid may be used as the process liquid used for the buff cleaning and the process liquid used in the rinse of the wafer W (step S2-40 in FIG. 18). Alternatively, different process liquid from each other may be used.

The buffing method explained above is an example. The control device 2-5 can determine on the basis of setting decided in advance whether the process liquid is stored on the inner side region of the wall section 2-402 and realize various buffing methods. For example, the control device 2-5 may control the height of the wall section 2-402 according to rotating speed of the buff table 2-400. Specifically, the control device 2-5 may control the actuator 2-406 to increase the height of the wall section 2-402 as the rotating speed is higher. Alternatively, when the buff table 2-400 is rotated at speed equal to or higher than predetermined speed (the polishing rate or the cleaning rate is increased), the control device 2-5 may manage the liquid surface level using the sensor 2-420 such that the liquid surface level of the process liquid L1 is lower than when the buff table 2-400 is rotated at speed lower than the predetermined speed. With these configurations, it is possible to reduce a scattering amount of the process liquid. That is, since the possibility of scattering of the process liquid L1 is low in the case of relatively low-speed rotation, it is possible to allow the process liquid L1 to be accumulated to a relatively high liquid surface level. In the case of high-speed rotation, since the possibility of scattering increases, the supply amount of the process liquid L1 is suppressed such that the liquid surface level is suppressed relatively low. Alternatively, the liquid surface level is adjusted by, for example, the discharge route 2-408 and the valve 2-410 shown in FIG. 17E while the process liquid L1 is supplied.

Alternatively, the control device 2-5 may once suspend the buffing at predetermined timing halfway in the buffing, discharge the whole amount of the process liquid stored in the inner side region of the wall section 2-402, and thereafter store process liquid supplied anew and resume the buffing. With such a configuration, it is possible to discharge, together with the stored process liquid, products caused by the buffing and continue the buffing using fresh process liquid not including these products. Therefore, it is possible to suppress the wafer W from being damaged by these products.

B. MODIFICATIONS

B-1. Modification 1

Figure 19:
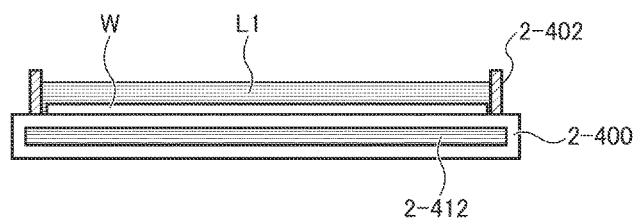
FIG. 19 is a schematic diagram showing a modified form of a buff table.

The buffing module 2-300A may include a temperature adjusting section that adjusts the temperature of the process liquid stored in the inner side region of the wall section 2-402. For example, as shown in FIG. 19, a temperature regulator 2-412 may be provided inside the buff table 2-400. The temperature regulator 2-412 may be a water jacket for temperature adjustment. Alternatively, the temperature adjusting section may adjust the temperature of supply liquid before being supplied to the wafer W. The process performance depends on the temperature of the process liquid. Therefore, with such a configuration, it is possible to optimize the process performance in terms of a temperature condition.

B-2. Modification 2

The buffing module 2-300A may include, as means for supplying the process liquid, only one of the external nozzles 2-710, 2-720, and 2-730 and the internal supply line 2-506. Since the process liquid can be stored on the inner side of the wall section 2-402, even when the buffing module 2-300A includes only the external nozzles, it is possible to sufficiently supply the process liquid to the interface between the wafer W and the buff pad 2-502. In this case, a complicated mechanism such as a rotary joint provided incidentally to the internal supply line 2-506 is unnecessary. Therefore, it is possible to simplify the apparatus configuration.

B-3. Modification 3

The wall section 2-402 may be disposed on the outer side than the buff table 2-400. As a form in this case, the wall section 2-402 may be disposed in the vicinity of the buff table 2-400. During the buffing (e.g., the latter period of the buffing shown in FIG. 18), in a state in which the position of the upper surface of the wafer W held on the buff table 2-400 and the position of the upper surface of the wall section 2-402 are matched, an edge portion of the wafer W may be buffed such that a portion of the buff head 2-500 is located on the wall section 2-402. With such a configuration, it is possible to buff the edge portion and an inner portion of the edge portion at a uniform pressure.

B-4. Modification 4

The buffing modules 2-300A and 2-300B are not limited to be included in the cleaning unit 2-4 and may be included in the polishing unit 2-3.

The embodiment of the present disclosure is explained above on the basis of the several examples. However, the embodiment of the disclosure is to facilitate understanding of the present disclosure and does not limit the present disclosure. It goes without saying that the present disclosure can be changed and improved without departing from the spirit of the present disclosure and equivalents of the present disclosure are included in the present disclosure. Any combination or omission of the components described in claims and the specification are possible in a range in which at least a part of the problems can be solved or a range in which at least a part of effects is attained.

REFERENCE SIGNS LIST

1 Housing
1a, 1b Partition walls
2 Load/unload unit
3, 3A, 3B, 3C, 3D Polishing units
4 Cleaning unit
5 Control device
6, 7 Linear transporters
10 Polishing pad
11 Lifter
12 Swing transporter
20 Front load section
21 Traveling mechanism
22 Conveying robot
30A, 30B, 30C, 30D Polishing tables
31A, 31B, 31C, 31D Top rings
32A, 32B, 32C, 32D Polishing-liquid supply nozzles
33A, 33B, 33C, 33D Dressers
34A, 34B, 34C, 34D Atomizers
36 Top ring shaft
180 Temporary placing table
190 Roll cleaning chamber
191 First conveying chamber
192 Pen cleaning chamber
193 Second conveying chamber
194 Drying chamber
195 Third conveying chamber
201A, 201B Roll cleaning modules
202A, 202B Pen cleaning modules
203, 204 Temporary placing tables
205A, 205B Drying modules
207 Fan filter unit
209, 210, 213 Conveying robots
211, 212, 214 Supporting shaft
300 Buffing chamber
300A, 300B Buffing modules
400 Buff table
500 Buff head
502 Buff pad
504 Shaft
506 Internal supply line
600 Buff arm
700 Liquid supply system
710 Pure-water external nozzle
712 Pure water pipe
712a Branching pure water pipe
714 Pure-water supply source
716, 718 Opening and closing valves
720 Chemical external nozzle
722 Chemical pipe
722a Branching chemical pipe
724 Chemical supply source
726, 728 Opening and closing valves 730 Slurry external nozzle
732 Slurry pipe
732a Branching slurry pipe
734 Slurry supply source
736, 738 Opening and closing valve
740 Liquid supply pipe
800 Conditioning section
810 Dress table
820 Dresser
1000 Substrate processing apparatus
2-1 Housing
2-1a Partition wall
2-2 Load/unload unit
2-3, 2-3A, 2-3B, 2-3C, 2-3D Polishing units
2-4 Cleaning unit
2-5 Control device
2-6, 2-7 Linear transporters
2-10 Polishing pad
2-11 Lifter
2-12 Swing transporter
2-20 Front load section
2-21 Traveling mechanism
2-22 Conveying robot
2-30A, 2-30B, 2-30C, 2-30D Polishing tables
2-31A, 2-31B, 2-31C, 2-31D Top rings
2-32A, 2-32B, 2-32C, 2-32D Polishing-liquid supply nozzles
2-33A, 2-33B, 2-33C, 2-33D Dressers
2-34A, 2-34B, 2-34C, 2-34D Atomizers
2-36 Top ring shaft
2-180 Temporary placing table
2-190 Roll cleaning chamber
2-191, 2-193, 2-195 First conveying chambers
2-192 Pen cleaning chamber
2-194 Drying chamber
2-201A, 2-201B Roll cleaning modules
2-202A, 2-202B Pen cleaning modules
2-203, 2-204 Temporary placing tables
2-205A, 2-205B Drying modules
2-207 Fan filter unit
2-209, 2-210 Conveying robots
2-211 Supporting shaft
2-213 Third conveying robot
2-300A exclusive Buffing module
2-300 Buffing chamber
2-300A, 2-300B Buffing modules
2-400 Buff table
2-402 Wall section
2-402a, 2-402c First portions
2-402b, 2-402d Second portions
2-404 Opening
2-406 Storage-amount adjusting section
2-406 Actuator
2-408 Discharge route
2-410 Valve
2-412 Temperature regulator
2-420 Sensor
2-500 Buff head
2-502 Buff pad
2-504 Shaft
2-506 Internal supply line
2-600 Buff arm
2-700 Liquid supply system
2-710 Pure-water external nozzle
2-710 External nozzle
2-712 Pure water pipe
2-712a Branching pure water pipe
2-714 Pure-water supply source
2-716, 2-718 Opening and closing valves
2-720 Chemical external nozzle
2-722 Chemical pipe
2-722a Branching chemical pipe
2-724 Chemical supply source
2-726, 2-728 Opening and closing valves
2-730 Slurry external nozzle
2-732 Slurry pipe
2-732a Branching slurry pipe
2-734 Slurry supply source
2-736, 2-738 Opening and closing valve
2-740 Liquid supply pipe
2-800 Conditioning section
2-810 Dress table
2-820 Dresser
2-1000 Substrate processing apparatus
W Wafer
L1, L2 Process liquid
DIW Pure water

What is claimed is:

1. A buffing apparatus for buffing a substrate, the buffing apparatus comprising:
a buff table for holding the substrate, the buff table being rotatable;
a buff head to which a buff pad for buffing the substrate is attachable, the buff head being rotatable and movable in a direction approaching the buff table and a direction away from the buff table, and an internal supply line for supplying a process liquid for the buffing to the substrate being formed inside the buff head;
an external nozzle provided separately through the internal supply line in order to supply the process liquid to the substrate; and
a control section configured to control an operation of the buffing apparatus, the control section configured to control the buffing apparatus to supply the process liquid through the internal supply line while the buff head approaches the buff table as close as the contact position.

2. A buffing apparatus for buffing a substrate, the buffing apparatus comprising:
a buff table for holding the substrate, the buff table being rotatable;
a buff head to which a buff pad for buffing the substrate is attachable, the buff head being rotatable and movable in a direction approaching the buff table and a direction away from the buff table, and an internal supply line for supplying a process liquid for the buffing to the substrate being formed inside the buff head;
an external nozzle provided separately through the internal supply line in order to supply the process liquid to the substrate; and
a control section configured to control an operation of the buffing apparatus, wherein
the control section is configured to control the buffing apparatus to supply the process liquid from the external nozzle in a state in which the buff table is rotated before the buff head approaches the buff table as close as a contact position for bringing the buff pad into contact with the substrate.

3. The buffing apparatus according to claim 2, wherein the control section is configured to control the buffing apparatus to supply the process liquid only through the internal supply line after a start of the buffing or after elapse of a predetermined time from the start of the buffing.

4. The buffing apparatus according to claim 2, wherein the control section is configured to control the buffing apparatus to supply the process liquid through both of the internal supply line and the external nozzle during the buffing.

5. The buffing apparatus according to claim 1, wherein the control section is configured to control the buffing apparatus to supply the process liquid from the external nozzle in a state in which rotation of the buff table is stopped before the buff head approaches the buff table as close as the contact position, and to move the buff head to the contact position after the supply is started, and start the rotation of the buff table.

6. The buffing apparatus according to claim 1,
wherein the control section is configured to control the buffing apparatus to, before the buff head approaches the buff table as close as a position for bringing the buff pad into contact with the substrate, supply the process liquid from the internal supply line in a state in which the buff table is rotated.

7. The buffing apparatus according to claim 1, wherein the control section is configured to supply the process liquid through the internal supply line after the buff head approaches the buff table as close as a position for bringing the buff pad into contact with the substrate in a state in which rotation of the buff table and the buff head is stopped and start the rotation of the buff table and the buff head after the process liquid is supplied for a predetermined time.

8. The buffing apparatus according to claim 2, wherein the control section is configured to control a load of the buff head such that a first load acts on the substrate with the buff head in an initial period of the buffing and a second load larger than the first load acts on the substrate in a period after the initial period.

9. A substrate processing apparatus comprising:
a chemical mechanical polishing apparatus; and
the buffing apparatus according to claim 1 for performing post process of a substrate processed by the chemical mechanical polishing apparatus.

10. A method for buffing a substrate with a buffing apparatus, the method comprising:
a step of disposing the substrate on a buff table for holding and rotating the substrate;
a step of supplying a process liquid from an external nozzle in a state in which the buff table is rotated before bringing a buff pad attached to a buff head, in which an internal supply line for supplying a process liquid for the buffing to the substrate is formed, into contact with the substrate; and
a step of performing the buffing while supplying the process liquid through the internal supply line after the step of supplying the process liquid from the external nozzle.

11. A method for buffing a substrate with a buffing apparatus, the method comprising:
a step of disposing the substrate on a buff table for holding and rotating the substrate;
a step of supplying a process liquid from an external nozzle in a state in which rotation of the buff table is stopped before bringing a buff pad attached to a buff head, in which an internal supply line for supplying a process liquid for the buffing to the substrate is formed, into contact with the substrate;
a step of bringing the buff pad into contact with the substrate and starting the rotation of the buff table after the supply of the process liquid from the external nozzle is started; and
a step of performing the buffing while supplying the process liquid through the internal supply line after the step of starting the rotation of the buff table.

12. The buffing apparatus according to claim 1, wherein the control section is configured to control the buffing apparatus to supply the process liquid only through the internal supply line after a start of the buffing or after elapse of a predetermined time from the start of the buffing.

13. The buffing apparatus according to claim 1, wherein the control section is configured to control the buffing apparatus to supply the process liquid through both of the internal supply line and the external nozzle during the buffing.

14. The buffing apparatus according to claim 2, wherein the control section is configured to control the buffing apparatus to supply the process liquid from the external nozzle in a state in which rotation of the buff table is stopped before the buff head approaches the buff table as close as the contact position, and to move the buff head to the contact position after the supply is started, and start the rotation of the buff table.

15. The buffing apparatus according to claim 2, wherein the control section is configured to control the buffing apparatus to, before the buff head approaches the buff table as close as a position for bringing the buff pad into contact with the substrate, supply the process liquid from the internal supply line in a state in which the buff table is rotated.

16. The buffing apparatus according to claim 2, wherein the control section is configured to supply the process liquid through the internal supply line after the buff head approaches the buff table as close as a position for bringing the buff pad into contact with the substrate in a state in which rotation of the buff table and the buff head is stopped and start the rotation of the buff table and the buff head after the process liquid is supplied for a predetermined time.

17. The buffing apparatus according to claim 1, wherein the control section is configured to control a load of the buff head such that a first load acts on the substrate with the buff head in an initial period of the buffing and a second load larger than the first load acts on the substrate in a period after the initial period.

18. A substrate processing apparatus comprising:
a chemical mechanical polishing apparatus; and
the buffing apparatus according to claim 2 for performing post process of a substrate processed by the chemical mechanical polishing apparatus.

* * * * *